United States Patent
Hasegawa

(10) Patent No.: US 9,300,253 B2
(45) Date of Patent: Mar. 29, 2016

(54) AMPLIFIER

(71) Applicant: FUJITSU SEMICONDUCTOR LIMITED, Yokohama-shi, Kanagawa (JP)

(72) Inventor: Nobumasa Hasegawa, Kawasaki (JP)

(73) Assignee: Socionext Inc., Yokohama (JP)

( * ) Notice: Subject to any disclaimer, the term of this patent is extended or adjusted under 35 U.S.C. 154(b) by 0 days.

(21) Appl. No.: 14/530,028

(22) Filed: Oct. 31, 2014

(65) Prior Publication Data

US 2015/0130540 A1    May 14, 2015

(30) Foreign Application Priority Data

Nov. 8, 2013  (JP) ................................. 2013-232158

(51) Int. Cl.
| | |
|---|---|
| H03F 1/00 | (2006.01) |
| H03F 1/02 | (2006.01) |
| H03F 1/32 | (2006.01) |
| H03F 3/24 | (2006.01) |
| H03F 3/45 | (2006.01) |

(52) U.S. Cl.
CPC ............ *H03F 1/0266* (2013.01); *H03F 1/3211* (2013.01); *H03F 3/245* (2013.01); *H03F 3/45475* (2013.01); *H03F 2200/411* (2013.01); *H03F 2200/534* (2013.01); *H03F 2200/537* (2013.01); *H03F 2200/541* (2013.01); *H03F 2200/555* (2013.01); *H03F 2203/45051* (2013.01); *H03F 2203/45112* (2013.01); *H03F 2203/45228* (2013.01); *H03F 2203/45244* (2013.01)

(58) Field of Classification Search
USPC .................. 330/165, 261, 188, 195, 127, 301
IPC ......................................................... H03F 1/00
See application file for complete search history.

(56) References Cited

U.S. PATENT DOCUMENTS

| 5,822,426 | A | * | 10/1998 | Rasmus | .................. | H04M 1/76 330/69 |
|---|---|---|---|---|---|---|
| 2003/0214359 | A1 | | 11/2003 | Sasho et al. | | |
| 2009/0273397 | A1 | * | 11/2009 | Bockelman | .......... | H03F 1/0277 330/51 |
| 2010/0117737 | A1 | * | 5/2010 | Kondo | .................. | H03F 1/0272 330/276 |
| 2011/0310775 | A1 | * | 12/2011 | Khlat | ........................ | H04L 5/14 370/278 |
| 2014/0087673 | A1 | * | 3/2014 | Mostov | ................. | H03F 1/0227 455/78 |
| 2015/0050901 | A1 | * | 2/2015 | Lee | ........................ | H03F 1/0277 455/127.3 |

FOREIGN PATENT DOCUMENTS

| JP | 2003-338713 A | 11/2003 |
|---|---|---|
| JP | 2005-45471 A | 2/2005 |

* cited by examiner

*Primary Examiner* — Patricia T Nguyen
(74) *Attorney, Agent, or Firm* — Arent Fox LLP

(57) ABSTRACT

An amplifier includes a first transformer configured to output first differential signals, a first differential amplifier coupled to the first transformer, a second transformer coupled to the first differential amplifier, a second differential amplifier coupled to the second transformer, a third transformer configured to transform second differential signals output from the second differential amplifier to a single-ended output signal, and a first bias circuit configured to supply a first bias voltage to a first secondary coil of the first transformer, wherein the first bias circuit sets the first bias voltage to a voltage greater than or equal to a first voltage based on the input signal in a first operating area where power of the output signal is greater than or equal to a first power so that power-gain characteristics of the output signal become closer to characteristics where gain of the output signal becomes constant.

13 Claims, 16 Drawing Sheets

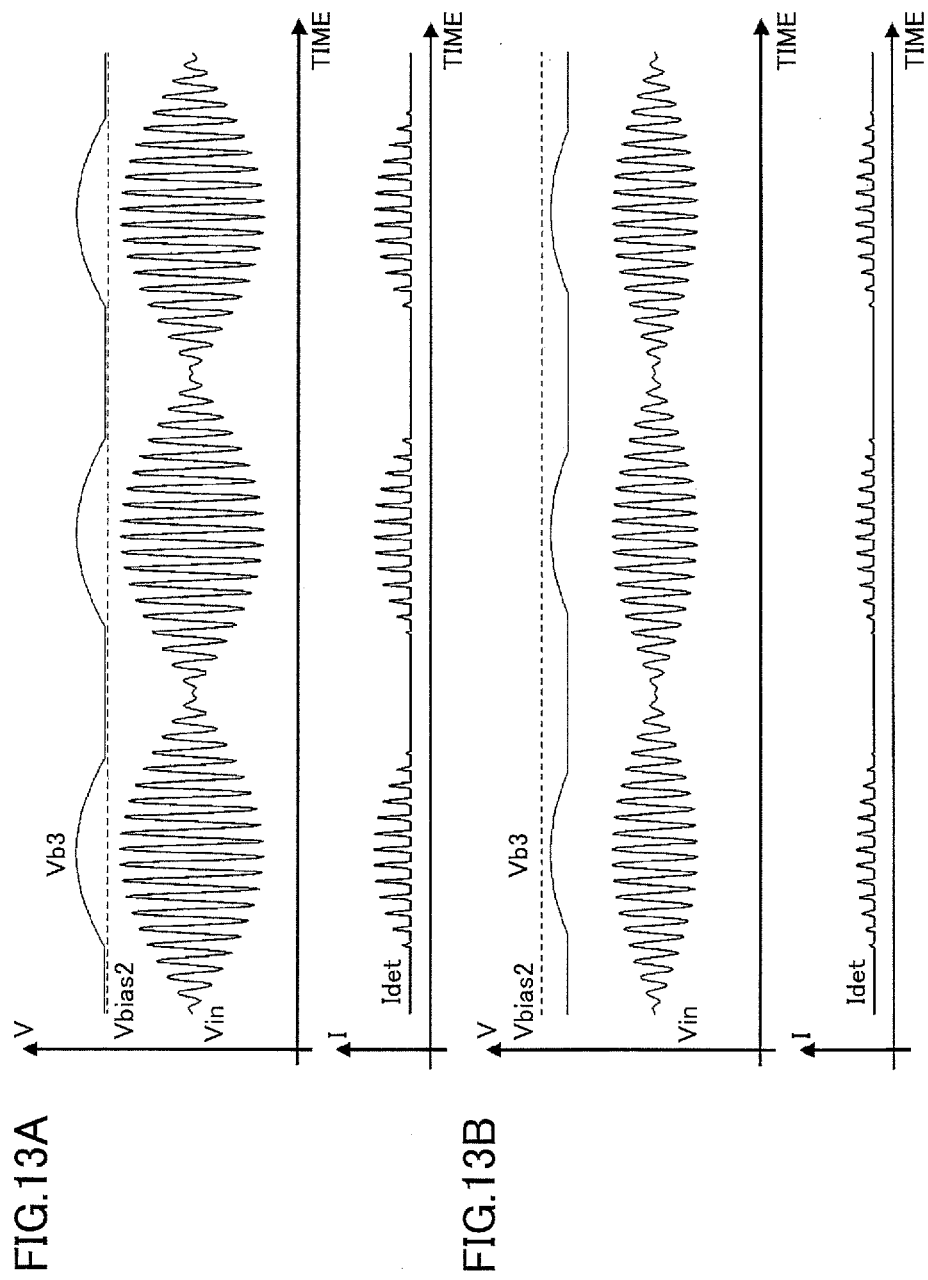

AMPLIFIER

CROSS-REFERENCE TO RELATED APPLICATIONS

This patent application is based upon and claims the benefit of priority of the prior Japanese Patent Application No. 2013-232158 filed on Nov. 8, 2013, the entire contents of which are incorporated herein by reference.

FIELD

The disclosures discussed herein relate to an amplifier.

BACKGROUND

There has been a power amplifying apparatus which includes a high-frequency amplifying means including transistors arranged in a plurality of stages and a feed-forwarding means which includes a detector that extracts a part of a high-frequency signal from an input side of the high-frequency amplifying means and transfers the extracted signal to an envelopes signal. The feed-forwarding means injects low-frequency signal output from the detector to a gate or a base-bias of the final stage of the high-frequency amplifying means (see, for example, patent document 1).

According to the conventional power amplifying apparatus, the feed-forwarding means injects the low-frequency signal output from the detector to the gate or the base-bias of the final stage of the high-frequency amplifying means.

However, an amplifying part of the final stage has larger size and greater gate capacitance than those of a primary stage. Therefore, it may be difficult to cause an output signal of the final stage to track an input signal of the high-frequency amplifying means, even though the feed-forwarding means injects the low-frequency signal output from the detector to the gate or the base-bias of the final stage.

In a case where it is difficult to cause the output signal of the final stage to track the input signal of the high-frequency amplifying means, the output signal may be distorted. If the output signal of the final stage is distorted, output signal-gain characteristics of the power amplifying apparatus become non-constant. Particularly, the distortion of the output signal becomes remarkable as a power of the output signal becomes higher.

PRIOR ART REFERENCES

Patent References

[Patent Reference 1]: Japanese Laid-open Patent Publication No. 2003-338713

SUMMARY

According to an aspect of an embodiment, there is provided an amplifier including, a first transformer configured to have a first primary side and a first secondary side, to transform an input signal input to the first primary side to first differential signals, and to output the first differential signals from the first secondary side, a first differential amplifier configured to have an input side and an output side, the input side being coupled to the first secondary side, a second transformer configured to have a second primary side and a second secondary side, the second primary side being coupled to the output side of the first differential amplifier, a second differential amplifier coupled to the second secondary side, a third transformer configured to transform second differential signals output from the second differential amplifier to a single-ended output signal, and a first bias circuit configured to supply a first bias voltage to a first secondary coil of the first transformer, wherein the first bias circuit is configured to set the first bias voltage to a voltage greater than or equal to a first voltage on the basis of the input signal in a first operating area where power of the output signal is greater than or equal to a first power so that power-gain characteristics of the output signal become closer to characteristics where gain of the output signal becomes constant in relation to power of the output signal.

The object and advantages of the invention will be realized and attained by means of the elements and combinations particularly pointed out in the appended claims.

It is to be understood that both the foregoing general description and the following detailed description are exemplary and explanatory and are not restrictive of the invention as claimed.

BRIEF DESCRIPTION OF THE DRAWINGS

FIG. 13A is a diagram illustrating relationships between the input signal Vin, the current Idet and a bias voltage Vbias2 obtained in the amplifier according to the embodiment in a large-signal operation mode;

FIG. 13B is a diagram illustrating relationships between the input signal Vin, the current Idet and bias voltage Vbias2 obtained in the amplifier according to the embodiment in a small-signal operation mode;

DESCRIPTION OF EMBODIMENTS

A description is given, with reference to the accompanying drawings, of embodiments of an amplifier.

Hereinafter, an amplifier according to an embodiment will be described. The amplifier of the embodiment may be used as a power amplifier located at a final stage of a transmission circuit included in a smartphone, a mobile phone and the like, for example.

At first, a transceiving circuit 500 of a smartphone will be described with reference to FIG. 1.

Figure 1:
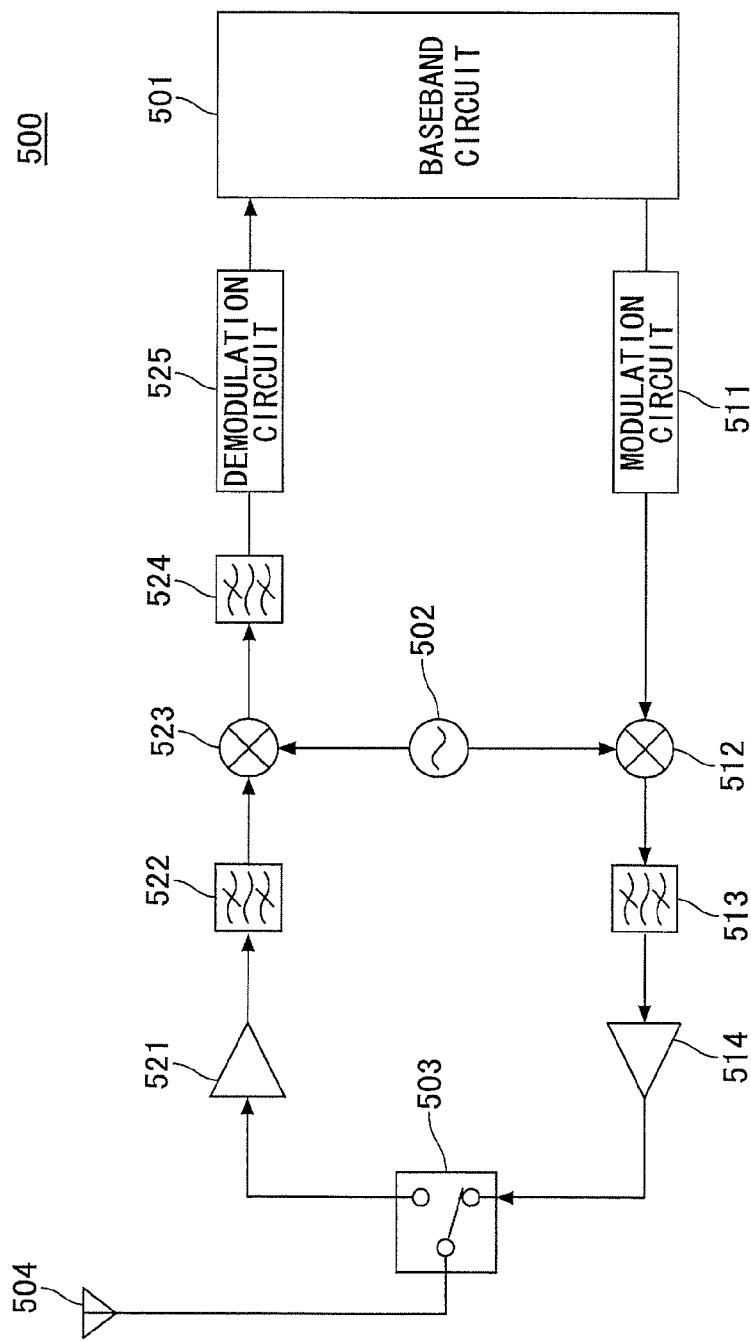
FIG. 1 is a diagram illustrating a transceiving circuit of a smartphone.

FIG. 1 is a diagram illustrating the transceiving circuit 500 of the smartphone. The transceiving circuit 500 includes a baseband circuit 501, an oscillator 502, an antenna switch 503, an antenna 504, a modulation circuit 511, a mixer 512, a transmit filter 513 and a power amplifier 514. The transceiving circuit 500 further includes a Low Noise Amplifier (LNA) 521, a receive filter 522, a mixer 523, a filter 524 and a demodulation circuit 525.

The baseband circuit 501 outputs a baseband signal. The oscillator 502 is connected to the mixers 512 and 523 and outputs a carrier wave signal to the mixers 512 and 523.

The antenna switch 503 is connected between an output terminal of the power amplifier 514, an input terminal of the LNA 521 and the antenna 504 and connects the antenna 504 to the power amplifier 514 or the LNA 521.

The antenna 504 is an antenna of the smartphone and transmits and receives data of voice, sound and the like and communication data.

The modulation circuit 511 modulates the baseband signal input from the baseband circuit 501 and outputs the modulated baseband signal. The mixer 512 mixes the baseband signal input from the baseband circuit 501 and the carrier wave signal input from the oscillator 502 and outputs a mixed transmission signal to the transmit filter 513.

The transmit filter 513 is a bandpass filter. The transmit filter 513 receives a signal from the mixer 512, passes a part of the signal at a designated frequency band as a transmission signal and outputs the transmission signal to the power amplifier 514.

The power amplifier 514 amplifies the transmission signal input from the transmit filter 513 and outputs the amplified transmission signal to the antenna 504 via the antenna switch 503.

The modulation circuit 511, the mixer 512, the transmit filter 513 and the power amplifier 514 constitute a transmission circuit.

The LNA 521 amplifies a received signal input from the antenna 504 via the antenna switch 503 and outputs the amplified received signal to the receive filter 522. The receive filter 522 is a bandpass filter. The receive filter 522 receives the received signal from the LNA 521 and passes a part of the received signal at a designated frequency band and outputs the passed received signal to the mixer 523.

The mixer 523 extracts a part of the received signal at a frequency band of the baseband signal based on the received signal input from the receive filter 522 and the carrier wave signal input from the oscillator 502.

The filter 524 is a bandpass filter. The filter 524 receives the received signal from the mixer 523, passes a part of the received signal at a designated band, and outputs the passed received signal to the demodulation circuit 525. The demodulation circuit 525 demodulates the received signal input from the filter 524 and outputs the demodulated signal to the baseband circuit 501.

As described above, the transceiving circuit 500 processes the transmission signal or the received signal between the baseband circuit 501 and the antenna 504. In the present embodiment, the amplifier which can be used as the power amplifier 514 will be described.

Since the power amplifier 514 located at the final stage of the transmission circuit is a high-frequency amplifier which transmits a signal to the base station via the antenna 504, the power amplifier 514 has a large gain. Therefore, the power amplifier 514 may cause distortion in the transmission signal output therefrom.

If a consumption current of the power amplifier 514 is increased, it becomes possible to maintain the distortion in the transmission signal to a certain low level. However, power consumption of the power amplifier 514 is a higher proportion of the power consumption of the entire smartphone or the mobile phone, so that it is not easy to increase the consumption current of the power amplifier 514.

Accordingly, it is necessary to reduce the distortion under a condition where an increase in the amount of the consumption current of the power amplifier 514 is minimized as much as possible.

Herein, an indicator of the distortion will be described. Although there are various indicators of the distortion, a third-order intermodulation distortion (IM3 signal) is used as the indicator in the present embodiment. Generally, IM3 signal is used as an indicator which indicates a level of a distortion of an amplifier.

Figure 2A:
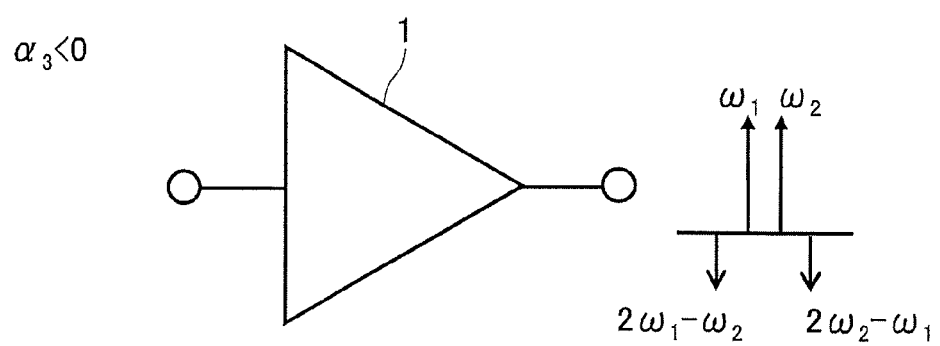
FIG. 2A is a diagram illustrating an amplifier of a comparative example and IM3 signals generated in the amplifier.
Figure 2B:
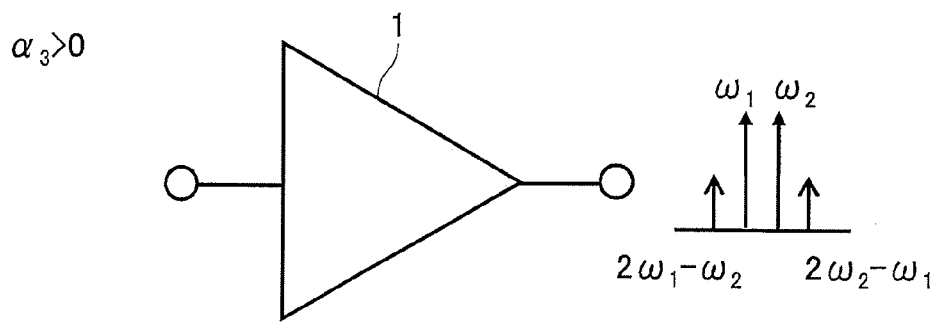
FIG. 2B is a diagram illustrating an amplifier of a comparative example and IM3 signals generated in the amplifier.

Herein, IM3 signal of an amplifier 1 according to a comparative example will be described with reference to FIGS. 2A and 2B. FIGS. 2A and 2B are diagrams illustrating the amplifier 1 of the comparative example and IM3 signals generated in the amplifier 1.

When two-tone signals are input to the amplifier 1 having non-linear gain characteristics, the IM3 signals are generated by the non-linear gain characteristics of the amplifier 1. The IM3 signals are signal components having angular frequencies of $2\omega_1-\omega_2$ and $2\omega_2-\omega_1$. IM3 signals are generated as follows.

The two-tone signals are two signals having the same amplitude with each other and angular frequencies of $\omega_1$ and $\omega_2$.

The two-tone signals x(t) are represented by a following formula (1).

$$x(t) = \cos\omega_1 t + \cos\omega_2 t \quad (1)$$

In this case, output signal y(t) of the amplifier 1 is represented by following formula (2), where $\alpha_1 > 0$.

$$y(t) = \alpha_1 x(t) + \alpha_2 x(t)^2 + \alpha_3 x(t)^3 \quad (2)$$

$$= \left(\alpha_1 + \frac{3}{4}\alpha_3 + \frac{3}{2}\alpha_3\right)\cos\omega_1 t + \left(\alpha_1 + \frac{3}{4}\alpha_3 + \frac{3}{2}\alpha_3\right)\cos\omega_2 t +$$

$$\alpha_2 \cos(\omega_1 + \omega_2)t + \alpha_2 \cos(\omega_1 - \omega_2)t +$$

$$\frac{3\alpha_3}{4}\cos(2\omega_1 + \omega_2)t + \frac{3\alpha_3}{4}\cos(2\omega_1 - \omega_2)t +$$

$$\frac{3\alpha_3}{4}\cos(2\omega_2 + \omega_1)t + \frac{3\alpha_3}{4}\cos(2\omega_2 - \omega_1)t$$

Components of $2\omega_1 - \omega_2$ and $2\omega_2 - \omega_1$ included in the output signal y(t) are IM3 signals. There are two IM3 signals having the angular frequency of $2\omega_1 - \omega_2$ and $2\omega_2 - \omega_1$. In a case where the amplifier 1 is a differential amplifier, a term of $\alpha_2 x(t)^2$ included in the output signal y(t) is cancelled, i.e., in this case, the output signal y(t) does not include the term of $\alpha_2 x(t)^2$.

Two IM3 signals become disturbing signals with regard to an adjacent channel which is adjacent to a channel of the input signal input to the amplifier 1.

In a case where $\alpha_3 < 0$, the gain of the amplifier 1 is represented by a decreasing function and phases of IM3 signals are opposite to phases of the two-tone signals, as illustrated in FIG. 2A.

In a case where $\alpha_3 > 0$, the gain of the amplifier 1 is represented by an increasing function and the phases of IM3 signals are the same as the phases of the two-tone signals, as illustrated in FIG. 2B.

The two-tone signals x(t) can be transformed into formula (3) by using formulae of trigonometric functions.

$$x(t) = \cos\omega_1 t + \cos\omega_2 t \quad (3)$$

$$= 2\sin\left(\frac{\omega_1 + \omega_2}{2}\right)t * \cos\left(\frac{\omega_1 - \omega_2}{2}\right)t$$

$$= 2\sin\left(\frac{\omega_1 + \omega_2}{2}\right)t * \cos\left(\frac{\omega_2 - \omega_1}{2}\right)t$$

As described in formula (3), a sine wave having frequency of $(\omega_1 + \omega_2)/2$ is multiplied by a cosine wave having frequency of $(\omega_1 - \omega_2)/2$.

Next, a detailed configuration of the amplifier 1 of the comparative example and a simulation result representing the distortion of output signal will be described before describing an amplifier of the present embodiment.

Figure 3A:
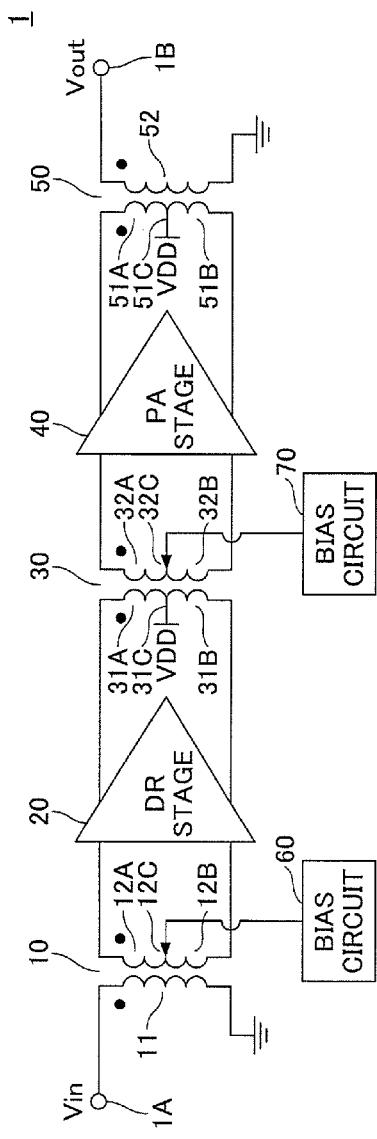
FIG. 3A is a diagram illustrating a detailed configuration of the amplifier of the comparative example.
Figure 3B:
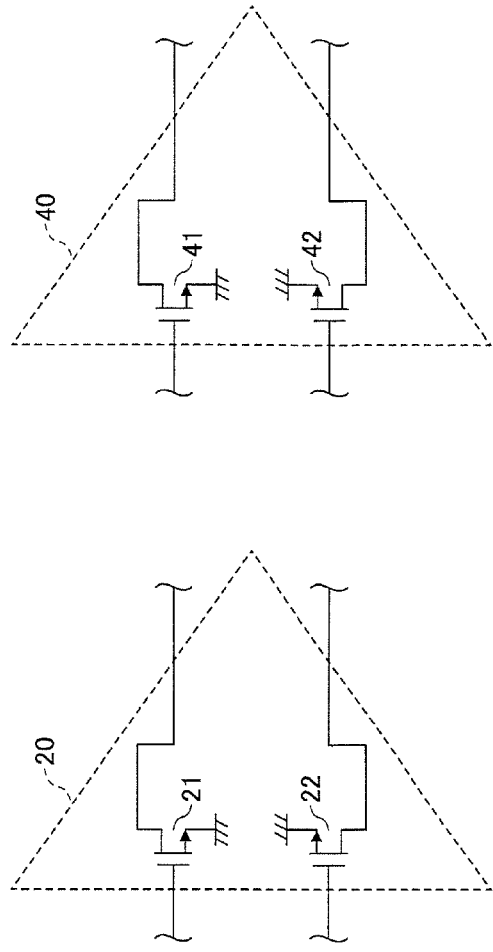
FIG. 3B is a diagram illustrating inner configurations of a DR stage and a PA stage included in the amplifier.

FIG. 3A is a diagram illustrating a detailed configuration of the amplifier 1 of the comparative example. FIG. 3B is a diagram illustrating inner configurations of a DR stage 20 and a PA stage 40 included in the amplifier 1.

As illustrated in FIG. 3A, the amplifier 1 of the comparative example includes an input terminal 1A, an output terminal 1B, an input transformer 10, the DR stage 20, an interstage transformer 30, the PA stage 40, an output transformer 50 and bias circuits 60 and 70.

Hereinafter, with regard to a primary winding and a secondary winding of each of the input transformer 10, the interstage transformer 30 and the output transformer 50 as illustrated in FIG. 1, a terminal located at upper side is referred to as a first terminal and a terminal located at lower side is referred to as a second terminal. With regard to the DR stage 20 and the PA stage 40 as illustrated in FIG. 1, an input terminal located at upper side is referred to as a first input terminal, an input terminal located at lower side is referred to as a second input terminal, an output terminal located at upper side is referred to as a first output terminal, and an output terminal located at lower side is referred to as a second output terminal.

The amplifier 1 is used as a power amplifier located at a final stage of a transmission circuit of a smartphone, a mobile phone and the like, for example, and is able to be used instead of the power amplifier 514 as illustrated in FIG. 1.

The input terminal 1A is a terminal connected to a filter or the like located at a preceding stage of the amplifier 1. A transmission signal is input to the input terminal 1A. The input terminal 1A is connected to a first terminal of a primary winding 11 of the input transformer 10.

The output terminal 1B is a terminal connected to an antenna or the like located at subsequent stage of the amplifier 1. The output terminal 1B outputs the transmission signal amplified by the amplifier 1. The output terminal 1B is connected to a first terminal of a secondary winding 52 of the output transformer 50.

Hereinafter, the transmission signal input to the input terminal 1A is referred to as an input signal of the amplifier 1 and the transmission signal which is amplified by the amplifier 1 and output from the output terminal 1B is referred to as an output signal of the amplifier 1.

The input transformer 10 includes the primary winding 11 and a pair of secondary windings 12A and 12B. The input transformer 10 functions as a matching transformer located at an input side. The first terminal of the primary winding 11 is connected to the input terminal 1A. A second terminal of the primary winding 11 is grounded.

The first terminal of the secondary winding 12A is connected to a first input terminal of the DR stage 20, and the second terminal of the secondary winding 12A is connected to a midpoint 12C. The secondary winding 12A and the primary winding 11 are wound in a homopolarity manner.

The first terminal of the secondary winding 12B is connected to the midpoint 12C, and the second terminal of the secondary winding 12B is connected to a second input terminal of the DR stage 20. The secondary winding 12B is wound in a reversed polarity manner with respect to the primary winding 11 and the secondary winding 12A.

The midpoint 12C is a connecting point of the secondary windings 12A and 12B. An output terminal of the bias circuit 60 is connected to the midpoint 12C. A bias voltage is supplied to the midpoint 12C from the bias circuit 60.

The DR stage 20 is an amplifier stage which functions as a driver stage or a primary stage. The DR stage 20 includes a pair of input terminals and a pair of output terminals. As described above, the upper side input terminal and the lower side input terminal are referred to as a first input terminal and a second input terminal, respectively. The upper side output terminal and the lower side output terminal are referred to as a first output terminal and a second output terminal, respectively. The first input terminal and the second input terminal of the DR stage are connected to the first terminal of the secondary winding 12A and the second terminal of the secondary winding 12B. The first output terminal and the second output terminal of the DR stage 20 are connected to a first terminal of a primary winding 31A and a second terminal of a primary winding 31B of the interstage transformer 30, respectively.

The DR stage 20 includes a pair of N-channel Metal Oxide Silicon (NMOS) transistors 21 and 22 as illustrated in FIG. 3B. With regard to a gate, a source and a drain of the NMOS transistor 2, the gate is connected to the first terminal of the secondary winding 12A, the source is grounded, and the drain is connected to a first terminal of the primary winding 31A. With regard to a gate, a source and a drain of the NMOS transistor 22, the gate is connected to the second terminal of the secondary winding 12B, the source is grounded, and the drain is connected to a second terminal of the primary winding 31B.

The DR stage 20 amplifies the transmission signal input from the input transformer 10 and outputs the amplified transmission signal to the interstage transformer 30.

The interstage transformer 30 includes the primary windings 31A and 31B and the secondary windings 32A and 32B, and functions as a matching transformer located between the DR stage 20 and the PA stage 40.

The first terminal of the primary winding 31A is connected to the first output terminal of the DR stage 20. The second terminal of the primary winding 31B is connected to the second output terminal of the DR stage 20. The second terminal of the primary winding 31A and the first terminal of the primary winding 31B are connected at a midpoint 31C. The midpoint 31C is connected to a direct-current power source VDD. The bias voltage VDD is supplied to the midpoint 31C from the direct-current power source VDD.

The first terminal of the secondary winding 32A is connected to a first input terminal of the PA stage 40. The second terminal of the secondary winding 32B is connected to a second input terminal of the PA stage 40.

The second terminal of the secondary winding 32A and the first terminal of the secondary winding 32B are connected at a midpoint 32C. The midpoint 32C is connected to an output terminal of the bias circuit 70. A bias voltage is supplied to the midpoint 32C from the bias circuit 70.

The primary winding 31A and the secondary winding 32A are wound in a homopolarity manner. The primary winding 31B and secondary winding 32B are wound in a homopolarity manner. The primary winding 31A and the primary winding 31B are wound in a reversed polarity manner. The secondary winding 32A and the secondary winding 32B are wound in a reversed polarity manner.

Polarities of the primary winding 31A and the secondary winding 32A are equal to the polarities of the primary winding 11 and the secondary winding 12A.

The PA stage 40 is an amplifier stage which functions as a final stage. The PA stage 40 includes a pair of input terminals and a pair of output terminals. As described above, the upper side input terminal and the lower side input terminal are referred to as a first input terminal and a second input terminal, respectively. The upper side output terminal and the lower side output terminal are referred to as a first output terminal and a second output terminal, respectively. The first input terminal and the second input terminal of the PA stage 40 are connected to the first terminal of the secondary winding 32A and the second terminal of the secondary winding 32B. The first output terminal and the second output terminal of the PA stage 40 are connected to a first terminal of a primary winding 51A and a second terminal of a primary winding 51B of the output transformer 50, respectively.

The PA stage 40 includes a pair of N-channel Metal Oxide Silicon (NMOS) transistors 41 and 42 as illustrated in FIG. 3B. With regard to a gate, a source and a drain of the NMOS transistor 41, the gate is connected to the first terminal of the secondary winding 32A, the source is grounded, and the drain is connected to a first terminal of the primary winding 51A. With regard to a gate, a source and a drain of the NMOS transistor 42, the gate is connected to the second terminal of the secondary winding 32B, the source is grounded, and the drain is connected to a second terminal of the primary winding 51B.

The PA stage 40 amplifies the transmission signal input from the interstage transformer 30 and outputs the amplified transmission signal to the output transformer 50.

The output transformer 50 includes primary windings 51A and 51B and a secondary winding 52. The output transformer 50 functions as a matching transformer located at an output side.

The first terminal of the primary winding 51A is connected to the first output terminal of the PA stage 40. The second terminal of the primary winding 51B is connected to a second output terminal of the PA stage 40. The second terminal of the primary winding 51A and the first terminal of the primary winding 51B are connected at a midpoint 51C.

The midpoint 51C is connected to the direct-current power source VDD. The bias voltage VDD is supplied to the midpoint 51C from the direct-current power source VDD.

The first terminal of the secondary winding 52 is connected to the output terminal 1B. The second terminal of the secondary winding 52 is grounded. The secondary winding 52 and the primary winding 51A are wound in a homopolarity manner. Polarities of the secondary winding 52 and the primary winding 51A are equal to those of the primary winding 31A and the secondary winding 32A of the interstage transformer 30.

The output transformer 50 transforms differential transmission signals transmitted from the PA stage 40 to the primary windings 51A and 51B into an single-ended transmission signal and outputs the single-ended transmission signal from the secondary winding 52 to the output terminal 1B.

In the amplifier 1 of the comparative example as described above, the bias circuit 60 supplies a DC bias voltage that optimizes circuit characteristics of the DR stage 20 to the midpoint 12C between the secondary windings 12A and 12B of the input transformer 10.

Similarly, the bias circuit 70 supplies a DC bias voltage that optimizes circuit characteristics of the PA stage 40 to the midpoint 32C between the secondary windings 32A and 32B of the interstage transformer 30.

Figure 4A:
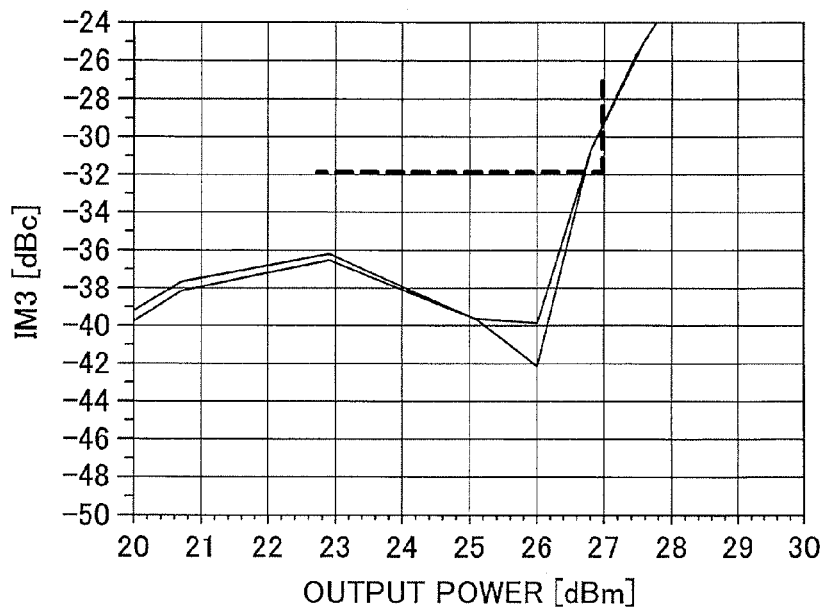
FIG. 4A is a diagram illustrating output power-IM3 signal level characteristics of the amplifier of the comparative example.
Figure 4B:
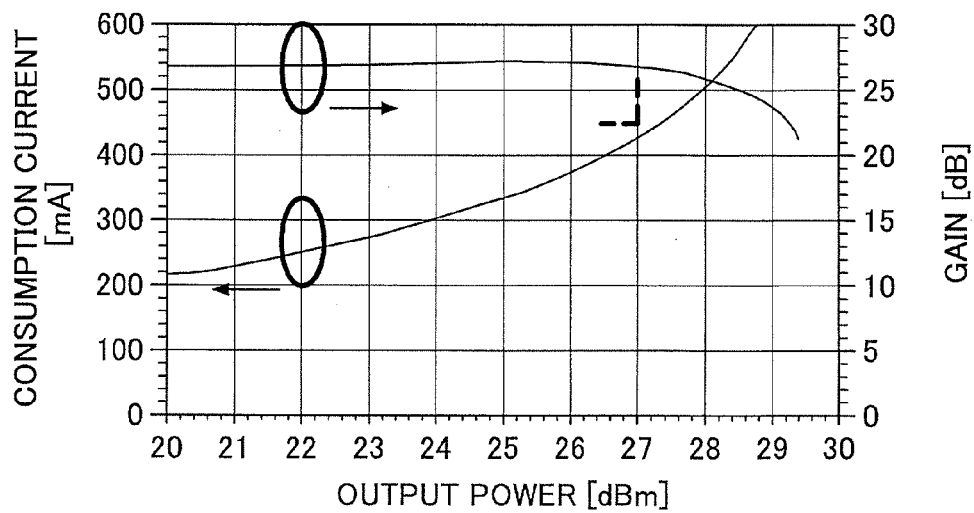
FIG. 4B is a diagram illustrating output power-consumption current characteristics and output power-gain characteristics of the amplifier of the comparative example.

FIG. 4A is a diagram illustrating output power-IM3 signal level characteristics of the amplifier 1 of the comparative example. FIG. 4B is a diagram illustrating output power-consumption current characteristics and output power-gain characteristics of the amplifier 1 of the comparative example. The characteristics as illustrated in FIGS. 4A and 4B are obtained by simulation. These simulation results are obtained by utilizing a harmonic balance analysis. The harmonic balance analysis is an analysis method which merges a transient analysis and an alternate current analysis.

The output power as illustrated in FIGS. 4A and 4B is power output from the output terminal 1B of the amplifier 1. The consumption current as illustrated in FIG. 4B is a current consumed by the amplifier 1 outputting the output power. The gain as illustrated in FIG. 4B is a gain of the output signal in relation to the input signal of the amplifier 1.

As an example, an operating point of the amplifier 1 is 27.0 dBm.

In FIG. 4A, a bold-dashed line indicates a maximum allowable level of the IM3 signal. The maximum allowable level of the IM3 signal is −32 dBc, if the output power is less than 27.0 dBm. The maximum allowable level of the IM3 signal takes a level of which an upper limit is not illustrated in FIG. 4A, if the output power is greater than 27.0 dBm.

In FIG. 4A, two fine solid lines indicate characteristics of the two IM3 signals having the angular frequencies of $2\omega_1-\omega_2$ and $2\omega_2-\omega_1$ as illustrated in FIGS. 2A and 2B. Since the two characteristics of the two IM3 signals are almost the same, the two characteristics will be described hereinafter without distinguishing the two characteristics.

As illustrated in FIG. 4A, the two IM3 signals exceed the maximum allowable level when the output power is around 27.0 dBm.

FIG. 4B illustrates the output power-consumption current characteristics and output power-gain characteristics. In FIG. 4B, a bold-dashed line indicates a maximum allowable level of the consumption current. The maximum allowable level of the consumption current is 440 mA, if the output power is less than 27.0 dBm. The maximum allowable level of the consumption current takes a level of which an upper limit is not illustrated in FIG. 4B, if the output power is greater than 27.0 dBm.

As illustrated in FIG. 4B, the consumption current is very close to the maximum allowable level at the operating point, i.e. when the output power is 27.0 dBm. Accordingly, it is difficult to increase the consumption current any more.

The gain increases gradually with increase of the output power in a small-signal operating area ranging from 20.0 dBm to 24.0 dBm and decreases drastically with increase of the output power in a large-signal operating area ranging from 26.0 dBm to 29.0 dBm.

According to the amplifier 1 of the comparative example, the consumption current is very close to the maximum allowable level at the operating point, i.e. at 27.0 dBm, and the IM3 signals exceed the maximum allowable level at the operating point.

The reason why the signal levels of the IM3 signals become so high is that the output power-gain characteristics are not constant and decrease drastically particularly in the large-signal operating area. The drastic decrease of the gain is a distortion of the output power-gain characteristics.

In general, the IM3 signal level is decreased, if the consumption current is increased. However, it is difficult for the amplifier 1 of the comparative example to increase the consumption current, because the consumption current is very close to the maximum allowable level. Hence, according to the comparative example, it is difficult to increase the consumption current in order to decrease the IM3 signal level.

If it is possible to correct the output power-gain characteristics so that the gain becomes constant in relation to the output power in the amplifier 1 of the comparative example, the IM3 signal level can be decreased.

Hereinafter, for example, level of the IM3 signal is used as an indicator which indicates a distortion level. The distortion level is evaluated by evaluating the IM3 signal level. However, a signal other than the IM3 signal may be used as the indicator in order to evaluate the distortion level. A signal other than the IM3 signal may be used as the indicator. In this case, it is possible to evaluate the distortion level in a manner similar to evaluating the IM3 signal.

Hereinafter, an amplifier of an embodiment the present invention will be described.

Embodiment

Figure 5:
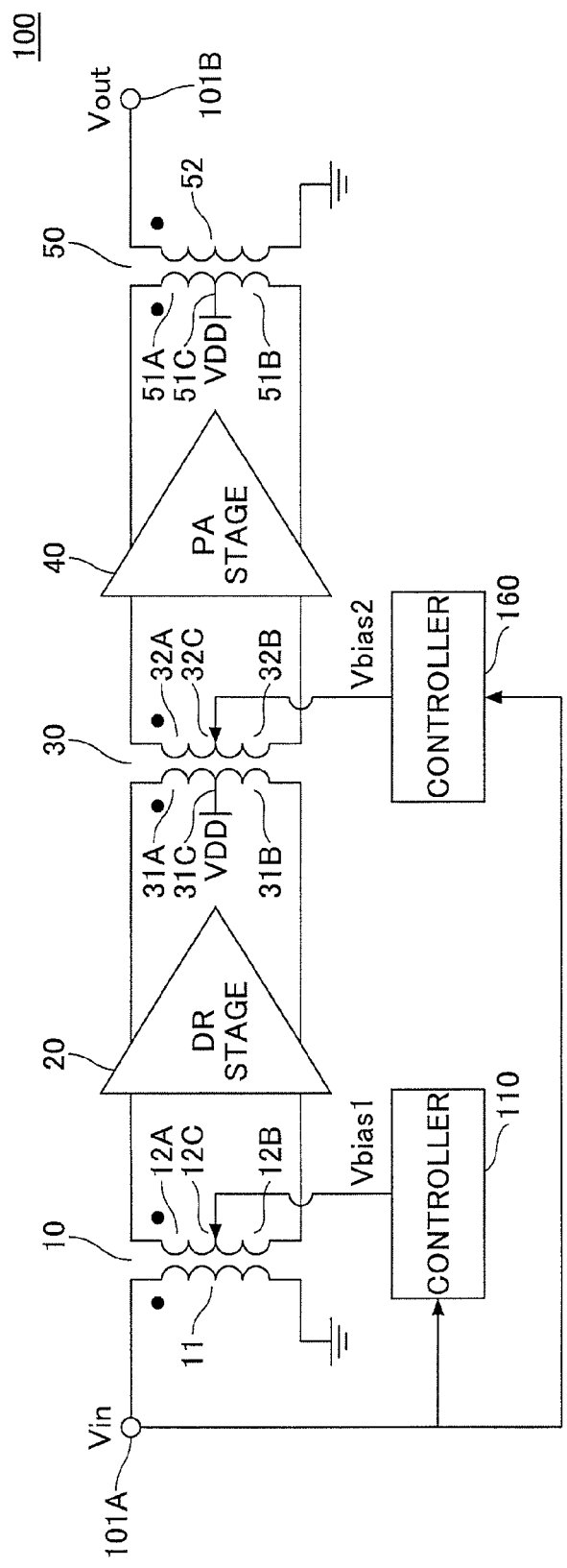
FIG. 5 is a diagram illustrating an amplifier of an embodiment.

FIG. 5 is a diagram illustrating an amplifier 100 of the embodiment. In FIG. 5, the same elements as or elements similar to those of the amplifier 1 (see FIG. 3) of the comparative example are referred to by the same reference numerals, and a description thereof is omitted.

As illustrated in FIG. 5, the amplifier 100 of the embodiment includes an input terminal 101A, an output terminal 101B, an input transformer 10, a DR stage 20, an interstage transformer 30, a PA stage 40, an output transformer 50 and controllers 110 and 160.

The input transformer 10 is one example of a first transformer. The DR stage 20 is one example of a first differential amplifier stage. The interstage transformer 30 is one example of a second transformer. The PA stage 40 is one example of a second differential amplifier stage. The output transformer 50 is one example of a third transformer.

The amplifier 100 is used as a power amplifier located at a final stage of a transmission circuit of a smartphone, a mobile phone and the like, for example, and is able to be used as the power amplifier 514 as illustrated in FIG. 1. In the present embodiment, the amplifier 100 will be described in a case where the amplifier 100 is used as the power amplifier 514 as illustrated in FIG. 1.

The input terminal 101A is a terminal connected to a filter such as the filter 513 (see FIG. 1) or the like located at a preceding stage of the amplifier 100. A transmission signal is input to the input terminal 101A. The input terminal 101A is connected to a first terminal of a primary winding 11 of the input transformer 10.

The output terminal 101B is a terminal connected to an antenna such as the antenna switch 503 (see FIG. 1) or the like located at a subsequent stage of the amplifier 100. The output terminal 101B outputs the transmission signal amplified by the amplifier 100. The output terminal 101B is connected to a first terminal of a secondary winding 52 of the output transformer 50.

Hereinafter, the transmission signal input to the input terminal 101A is referred to as an input signal (Vin) of the amplifier 100 and the transmission signal which is amplified by the amplifier 100 and output from the output terminal 101B is referred to as an output signal (Vout) of the amplifier 100.

The input transformer 10, the DR stage 20, the interstage transformer 30, the PA stage 40 and the output transformer 50 of the amplifier 100 according to the embodiment are similar to the input transformer 10, the DR stage 20, the interstage transformer 30, the PA stage 40 and the output transformer 50 of the amplifier 1 according to the comparative example (see FIG. 3), respectively.

The controllers 110 and 160 of the amplifier 100 according to the embodiment control bias voltages Vbias1 and Vbias2 by performing feed-forward control based on the input signal input from the input terminal 101A, respectively. The controllers 110 and 160 supply the bias voltages Vbias1 and Vbias2 to midpoints 12C and 32C located at secondary sides of the input transformer 10 and the interstage transformer 30, respectively.

Therefore, the controllers 110 and 160 are connected to the input terminal 101A. The controller 110 is one example of a first bias circuit. The controller 160 is one example of a second bias circuit.

To be more precise, the controller 110 increases voltage value of the bias voltage Vbias1 in accordance with an amplitude of the input signal in the large-signal operating area. The controller 110 increases the voltage value of the bias voltage Vbias1 as described above in order to correct the gain characteristics of the DR stage 20 in relation to the output power so that the gain characteristics become closer to constant gain characteristics in the large-signal operating area.

The reason for correcting the gain characteristics of the DR stage 20 by controlling the bias voltage Vbias1 is as follows. Size of the DR stage 20 is smaller than that of the PA stage 40, and thus a gate capacitance of the DR stage 20 is smaller than that of the PA stage 40. Accordingly, it is easier to perform driving control of the DR stage 20 than to perform driving control of the PA stage 40.

For the sake of realizing the driving control as described above, the gain in relation to the output power in the large-signal operating area is adjusted by causing the controller 110 to set a cutoff frequency of the DR stage 20 which can track the input signal. The size of the DR stage 20 is about a half to one-tenth of that of the PA stage 40, for example.

The controller 160 increases the bias voltage Vbias2 in the small-signal operating area where power of the input signal is low, and decreases the bias voltage Vbias2 in the large signal operating area where the power of the input signal is high. This is for the sake of correcting the gain characteristics of the PA stage 40 so that the gain characteristics become closer to constant gain characteristics in the small-signal operating area.

Since the PA stage 40 has greater gate capacitance than that of the DR stage 20, the controller 160 can improve the gain characteristics of the PA stage 40 in the small-signal operating area without increasing the cutoff frequency of the PA stage 40.

Detailed operation of the controllers 110 and 160 and detailed operation of the DR stage 20 and the PA stage 40 will be described hereinafter.

Next, details of the input signal of the amplifier 100 will be described with reference to FIG. 6.

Figure 6:
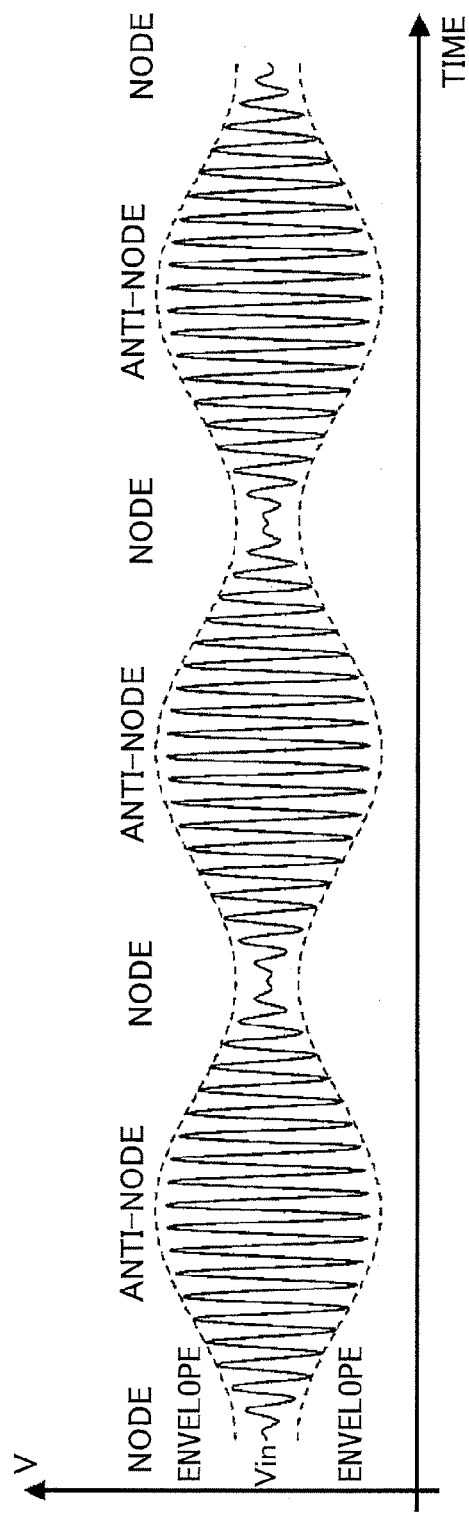
FIG. 6 is a diagram illustrating an input signal input to the amplifier of the embodiment.

FIG. 6 is a diagram illustrating the input signal input to the amplifier 100. The input signal is a two-tone signal Vin indicated by a solid line and is similar to the two-tone signals x(t) as represented by formula (1). The two-tone signal Vin is obtained by mixing the baseband signal output from the baseband circuit 501 and the carrier wave signal output from the oscillator 502 at the mixer 512 and by transmitting the mixed signal to the filter 513. The two-tone signal Vin is obtained as an output signal of the filter 513.

The two-tone signal Vin represented by the solid line has a wave-shape having an envelopes amplitude represented by two dashed lines as illustrated in FIG. 6. The envelopes illustrated by the dashed lines represent the baseband signal output from the baseband circuit 501. The envelopes illustrated above and below the two-tone signal Vin, respectively, represent the baseband signal. Frequencies of the envelopes are from several MHz to 20 MHz, for example.

FIG. 6 illustrates three anti-nodes and five nodes for the envelopes. The amplitude of the baseband signal becomes greater at the anti-nodes of the envelopes, and the amplitude of the baseband signal becomes smaller at the nodes of the envelopes.

According to the amplifier 100 of the present embodiment, the controllers 110 and 160 detect amplitudes obtained between the envelopes included in the two-tone signal Vin and control the bias voltages Vbias1 and Vbias2 supplied to the midpoints 12C and 32C located at the secondary sides of the input transformer 10 and the interstage transformer 30, respectively. The amplitude of the envelopes is the same as the amplitude of the baseband signal.

Hereinafter, the large-signal operating area is an operating area in which the output power of the amplifier 100 is relatively high and the output power is from 26.0 dBm to 29.0 dBm as illustrated in FIGS. 4A and 4B, for example. In the large-signal operating area, the amplitude (the amplitudes at the anti-nodes) obtained between the envelopes of the input signal Vin becomes greater. This is because the amplitude of the envelopes (i.e., the amplitude of the baseband signal) corresponds to the output power. In a large-signal operation mode, the amplifier 100 is driven in the large-signal operating area.

The small-signal operating area is an operating area in which the output power of the amplifier 100 is relatively low and the output power is from 20 dBm to 24 dBm as illustrated in FIGS. 4A and 4B, for example. In the small-signal operating area, the amplitude (the amplitudes at the anti-nodes) obtained between the envelopes of the input signal Vin becomes smaller. In a small-signal operation mode, the amplifier 100 is driven in the small-signal operating area.

In the following, a configuration of the controller 110 included in the amplifier 100 according to the embodiment is described with reference to FIG. 7.

Figure 7:
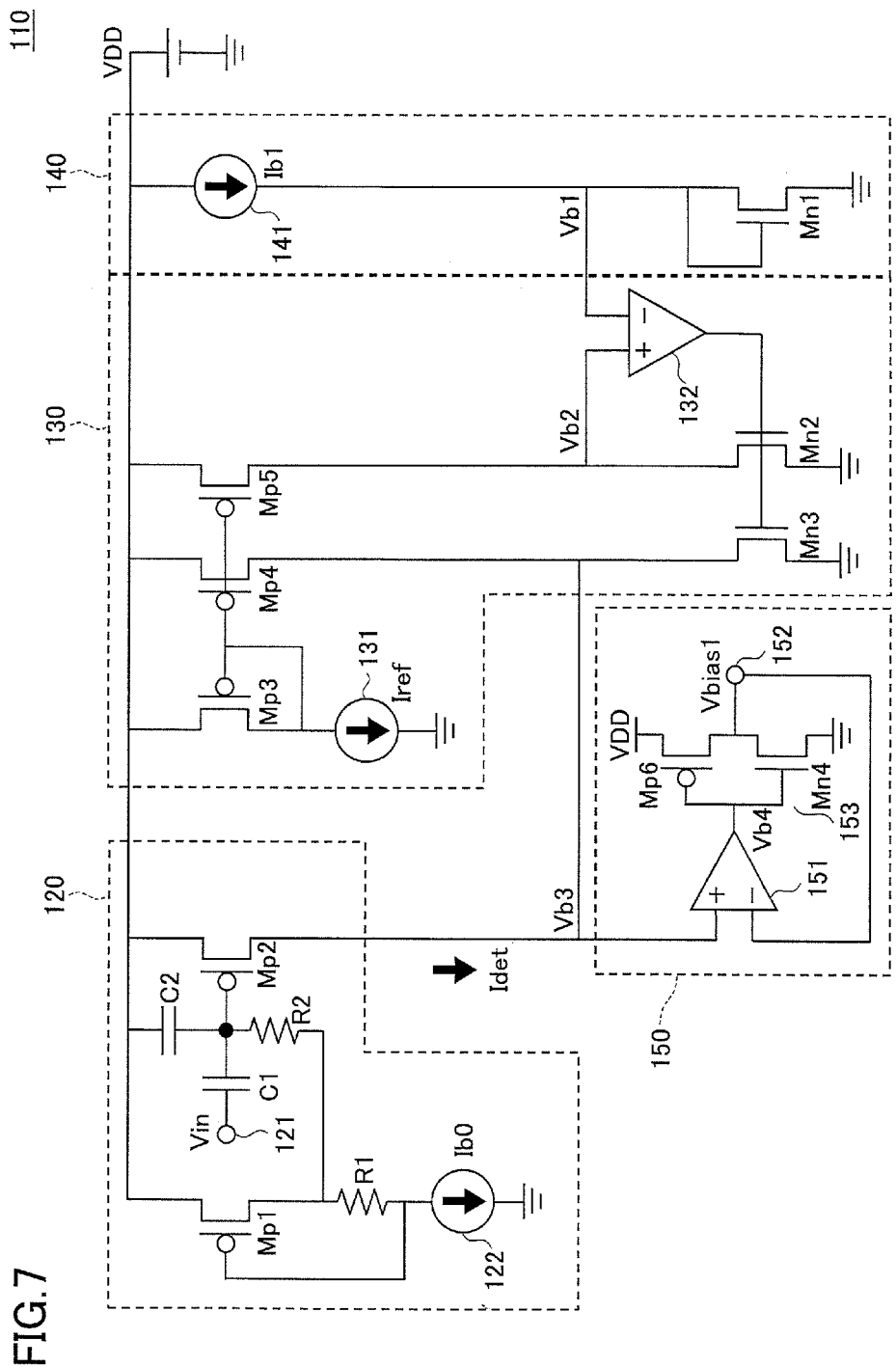
FIG. 7 is a diagram illustrating a controller included in the amplifier of the embodiment.

FIG. 7 is a diagram illustrating the controller 110 included in the amplifier 100 of the embodiment.

The controller 110 includes an envelope detector 120, an I-V converter 130, a core bias circuit 140 and a buffer 150.

The envelope detector 120 includes an input terminal 121, a transistor Mp1, a resistor R1, a current source 122, capacitors C1 and C2, a resistor R2 and a transistor Mp2. The envelope detector 120 is one example of the first envelope detector.

The input terminal 121 is connected to the input terminal 101A (see FIG. 5) of the amplifier 100 and the input signal Vin is input to the input terminal 121. The input terminal 121 is connected to one of terminals of the capacitor C1 in the envelope detector 120.

The transistor Mp1 is a P-channel Metal Oxide Semiconductor (PMOS) transistor. With regard to a source, a drain and a gate of the transistor Mp1, the source is connected to the direct-current power source VDD, the drain is connected to the resistors R1 and R2, and the gate is connected to the drain via the resistor R1 and an input terminal of the current source 122.

The transistor Mp1, the resistor R1 and the current source 122 constitute a bias circuit which generates a bias voltage supplied to the gate of the transistor Mp2.

The resistor R1 constitutes the bias circuit with the transistor Mp1 and the current source 122 which supplies the bias voltage to the gate of the transistor Mp2.

With regard to an input terminal and an output terminal of the current source 122, the input terminal is connected to the resistor R1 and the gate of the transistor Mp1 and the output terminal is grounded. The current source 122 outputs a current Ib0. The current source 122 constitutes the bias circuit with the transistor Mp1 and the resistor R1 which supplies the bias voltage to the gate of the transistor Mp2.

The capacitor C1 is connected between the input terminal 121 and the gate of the transistor Mp2. The capacitor C2 is connected between the direct-current power source VDD and the gate of the transistor Mp2. The resistor R2 is connected between the gate of the transistor Mp2, the drain of the transistor Mp1 and the resistor R1.

The gate of the transistor Mp2 is driven by the bias circuit constituted by the transistor Mp1, the resistor R1 and the current source 122, and thereby the transistor Mp2 operates as a class C amplifier. The bias circuit including the transistor Mp1, the resistor R1 and the current source 122 supplies a voltage which is less than or equal to a threshold voltage of the transistor Mp2 to the gate of the transistor Mp2.

Accordingly, the transistor Mp2 outputs the current Idet corresponding to the amplitude of the input signal Vin in a case where the amplitude of the input signal Vin input to the input terminal 121 is greater than or equal to a designated amplitude. Since the input signal Vin is two-tone signal Vin, the current Idet corresponding to the amplitude of the envelopes as illustrated in FIG. 6 is output from the drain of the transistor Mp2.

In a manner as described above, the envelope detector 120 outputs the current Idet corresponding to the amplitude of the envelopes from the drain of the transistor Mp2 in a case where the amplitude of the envelopes of the input signal Vin (the two-tone signal Vin) is greater than or equal to the designated amplitude.

Here, a node connected to the drain of the transistor Mp2 of the envelope detector 120 is referred to as a node Vb3 having a voltage Vb3.

The I-V converter 130 includes a current source 131, an Op-amp 132, transistors Mp3, Mp4, Mp5, Mn2 and Mn3, and converts a current value input to the I-V converter 130 into a voltage value. The I-V converter 130 is one example of a first converter.

With regard to an input terminal and an output terminal of the current source 131, the input terminal is connected to the drain of the transistor Mp3 and the output terminal is grounded. The current source 131 outputs a reference current Iref.

With regard to a non-inverting input terminal and an inverting input terminal of the Op-amp 132, the non-inverting input terminal is connected to the node Vb2 and the inverting input terminal is connected to the node Vb1. An output terminal of the Op-amp 132 is connected to gates of the transistors Mn2 and Mn3.

The transistor Mp3 and Mp4 are PMOS transistors and constitute a current mirror circuit. With regard to a source, a gate and a drain of the transistor Mp3, the source is connected to the direct-current power source VDD, the gate is connected to the drain, and the drain is connected to the input terminal of the current source 131. Accordingly, the transistor Mp3 is diode-connected to the input terminal of the current source 131.

With regard to a source, a gate and a drain of the transistor Mp4, the source is connected to the direct-current power source VDD, the gate is connected to the gate of the transistor Mp3, and the drain is connected to the drain of the transistor Mn3. A connecting point between the drain of the transistor Mp4 and the drain of the transistor Mn3 is connected to the node Vb3.

With regard to a source, a gate and a drain of the transistor Mp5, the source is connected to the direct-current power source VDD, the gate is connected to the gates of the transistors Mp3 and Mp4, and the drain is connected to the drain of the transistor Mn2 and the non-inverting input terminal of the Op-amp 132 via the node Vb2.

The transistors Mn2 and Mn3 are N-channel Metal Oxide Semiconductor (NMOS) transistors. With regard to a drain, a source and a gate of the transistor Mn2, the drain is connected to the node Vb2, the source is grounded, and the gate is connected to the gate of the transistor Mn3 and the output terminal of the Op-amp 132.

With regard to a drain, a source and a gate of the transistor Mn3, the drain is connected to the drain of the transistor Mp4, the source is grounded, and the gate is connected to the gate of the transistor Mn2 and the output terminal of the Op-amp 132.

According to the I-V converter 130, a value of an input resistance of the I-V converter 130 as viewed from the node Vb3 is determined by output resistances values of the transistors Mp4 and Mn3.

Since the transistors Mp4 and Mn3 are connected in parallel with each other with respect to the node Vb3, the input resistance as viewed from the node Vb3 is a combined resistance of an output resistance rdsp of the transistor Mp4 and an output resistance rdsn of the transistor Mn3.

Since the I-V converter 130 has a circuit configuration as described above, the I-V converter 130 converts the current Idet flowing through the node Vb3 into the voltage value Vb3 by using the value of the input resistance as viewed from the node Vb3.

The core bias circuit 140 includes a current source 141 and a transistor Mn1. With regard to an input terminal and an output terminal of the current source 141, the input terminal is connected to the direct-current power source VDD, and the output terminal is connected to a drain of the transistor Mn1 and an inverting input terminal of the Op-amp 132 via the node Vb1. The current source 141 outputs a current Ib1.

The transistor Mn1 is an NMOS transistor. With regard to the drain, a gate and a source of the transistor Mn1, the drain is connected to the gate, the drain is connected to the node Vb1, and the source is grounded.

Since the current source 141 which outputs the current Ib1 is diode-connected to the transistor Mn1, the current Ib1 is always flowing to the node Vb1 in the core bias circuit 140. Therefore, a voltage at the node Vb1 is a direct voltage Vb1. As described above, the core bias circuit 140 generates and outputs the direct voltage Vb1 to the node Vb1.

Since the core bias circuit 140 outputs the direct voltage Vb1 to the node Vb1, a voltage Vb2 at the node Vb2 becomes equal to the voltage Vb1 at the node Vb1. Hence, the voltage Vb1 at the node Vb1 is copied to the node Vb2 as the voltage Vb2.

In the I-V converter 130, a ratio of a size of the transistor Mp5 and a size of the transistor Mp4 is set so that the ratio becomes equal to a ratio of a size of the transistor Mn2 and a size of the transistor Mn3.

Accordingly, the voltage Vb3 at the node Vb3 becomes equal to the voltage Vb2 at the node Vb2. As a result, the voltage Vb3 becomes equal to the voltage Vb1.

The buffer 150 includes an Op-amp 151, an output terminal 152 and an inverter 153.

With regard to a non-inverting input terminal, an output terminal and an inverting input terminal of the Op-amp 151, the non-inverting input terminal is connected to the node Vb3, the output terminal is connected to the input terminal of the inverter 153, and the inverting input terminal is connected to the output terminal 152.

The output terminal 152 is connected to an output terminal of the inverter 153. The output terminal 152 is connected to the midpoint 12C located at the secondary side of the input transformer 10 as illustrated in FIG. 5, and supplies the bias voltage Vbias1 to the midpoint 12C.

The inverter 153 includes transistors Mp6 and Mn4. An input terminal of the inverter 153 is connected to the output terminal of the Op-amp 151. An output terminal of the inverter 153 is connected to the output terminal 152.

The transistor Mp6 is a PMOS transistor. With regard to a source, a gate and a drain of the transistor Mp6, the source is connected to the direct-current power source VDD, the gate is connected to the input terminal of the inverter 153 and the gate of the transistor Mn4, and the drain is connected to the drain of the transistor Mn4 and the output terminal of the inverter 153.

With regard to a drain, a source and a gate of the transistor Mn4, the drain is connected to the drain of the transistor Mp6 and the output terminal of the inverter 153, the source is grounded, and the gate is connected to the gate of the transistor Mp6 and the input terminal of the inverter 153.

Hereinafter, a node located between the output terminal of the Op-amp 151 and the input terminal of the inverter 153 is referred to as a node Vb4 having a voltage Vb4.

The buffer 150 operates so that the voltage Vb3 input to the non-inverting input terminal of the Op-amp 151 and the bias voltage Vbias1 input to the inverting input terminal of the Op-amp 151 become equal to each other. Accordingly, the voltage Vb3 at the node Vb3 is equal to the bias voltage Vbias1 output from the output terminal 152.

The buffer 150 is disposed for the sake of making the cutoff frequency of the signal at the node Vb3, the node Vb4 and the output terminal 152 higher than the frequency of the envelopes by reducing a parasitic capacitance of the node Vb3. The buffer 150 reduces the parasitic capacitance of the node Vb3.

In the following, effects of disposing the I-V converter 130 and the buffer 150 will be described with reference to FIGS. 8A and 8B.

Figure 8A:
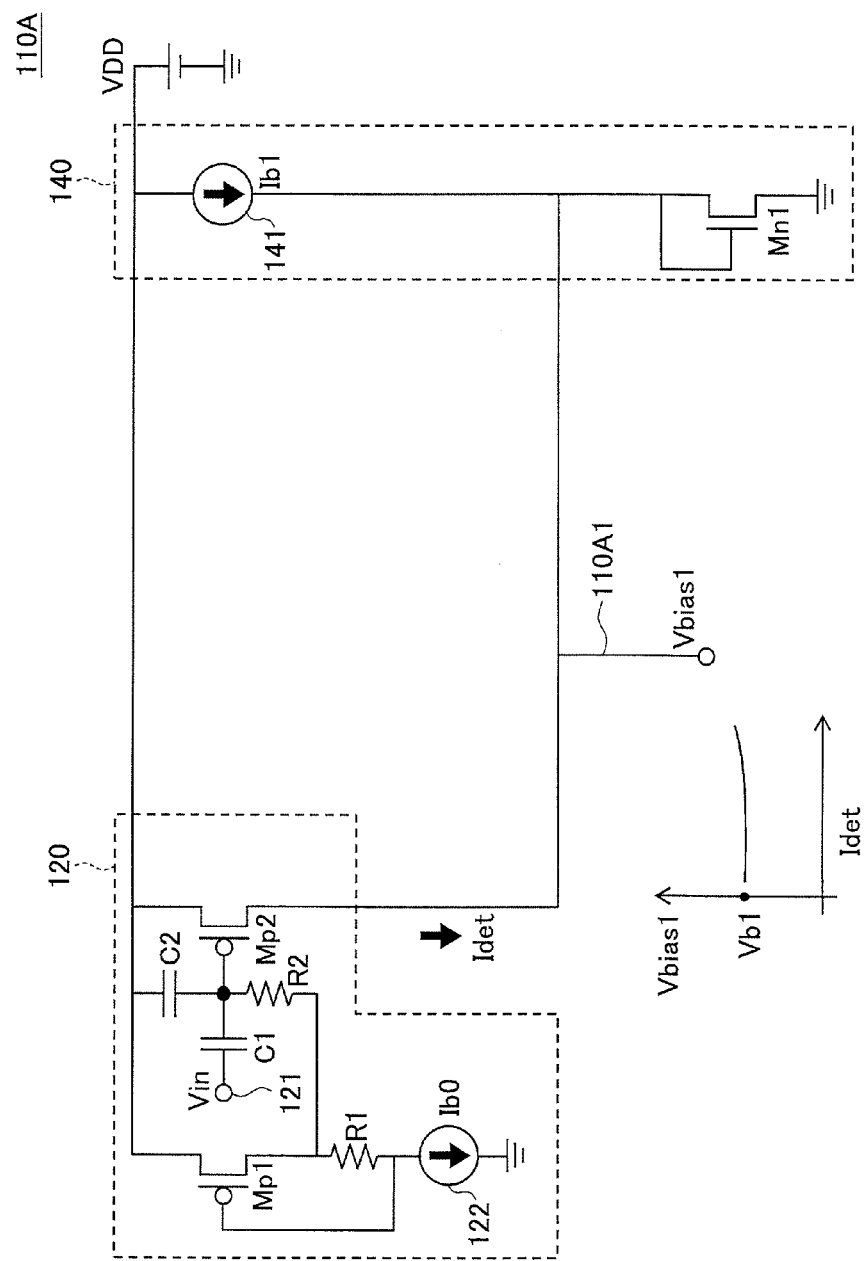
FIG. 8A is a diagram illustrating a controller.
Figure 8B:
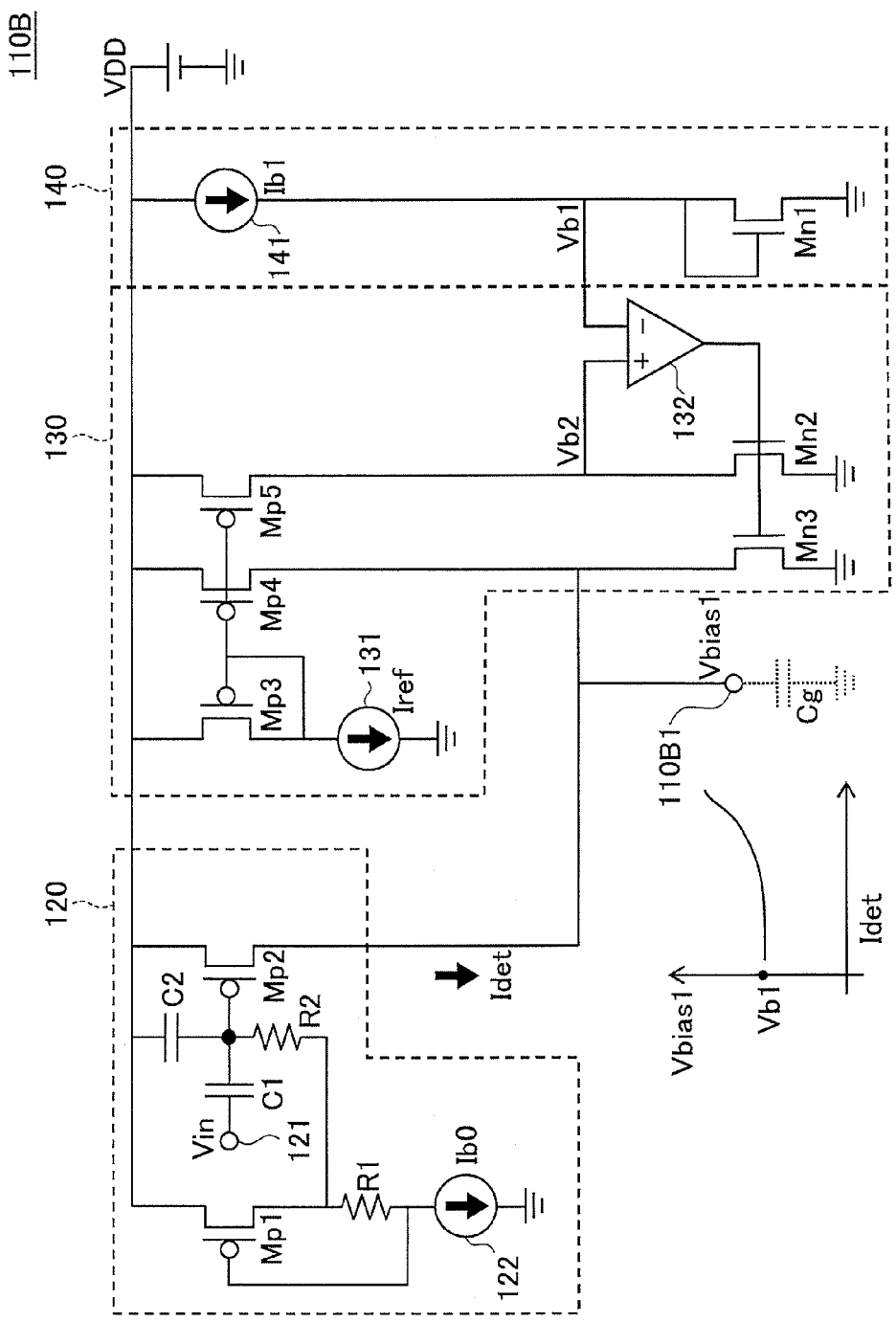
FIG. 8B is a diagram illustrating a controller.

With reference to FIGS. 8A and 8B, effects of disposing the I-V converter 130 and the buffer 150 in the controller 110 of the amplifier 100 according to the present embodiment will be described.

FIG. 8A is a diagram illustrating a controller 110A. The controller 110A has a configuration which is obtained by deleting the I-V converter 130 and the buffer 150 from the controller 110 as illustrated in FIG. 7. The controller 110A outputs the bias voltage Vbias1 from a node 110A1 located between the drain of the transistor Mp2 of the envelope detector 120 and the connecting point of the current source 141 of the core bias circuit 140 and the transistor Mn1.

Since the controller 110A as illustrated in FIG. 8A does not include the I-V converter 130, an input resistance of a connecting point located between the current source 141 of the core bias circuit 140 and the transistor Mn1 as viewed from the envelope detector 120 becomes smaller. The connecting point corresponds to the node Vb1 as illustrated in FIG. 7.

Therefore, a voltage at the connecting point does not increase from the voltage Vb1, and thereby the bias voltage Vbias1 does not increase in accordance with the current Idet output from the envelope detector 120.

Accordingly, the bias voltage Vbias1 supplied to the midpoint 12C at the secondary side of the input transformer 10 is not a voltage corresponding to the current Idet.

For the above reason, the I-V converter 130 having a high input resistance as viewed from the node Vb3 (see FIG. 7) is disposed between the envelope detector 120 and the core bias circuit 140.

FIG. 8B is a diagram illustrating a controller 110B. The controller 110B has a configuration which is obtained by deleting a buffer 150 from the controller 110 as illustrated in FIG. 7. The controller 110B outputs the bias voltage Vbias1 from a node 110B1 located between the drain of the transistor Mp2 of the envelope detector 120 and the connecting point of the transistors Mp4 and Mn3 of the I-V converter 130.

In the controller 110B, the I-V converter 130 provides a high input resistance as viewed from the envelope detector 120. However, a parasitic capacitance at the node 110B1 from which the bias voltage Vbias1 is output becomes higher.

A cutoff frequency at the node 110 B1 is represented as $1/(2\pi \times Rin \times Cg)$, where the parasitic capacitance of the node 110B1 is Cg. Rin is an input resistance of the I-V converter 130 as viewed from the envelope detector 120.

Hence, the cutoff frequency at the node 110B1 decreases, if the parasitic capacitance Cg is increased.

In the present embodiment, it is necessary to supply the bias voltage Vbias1 to the midpoint 12C in a manner that the bias voltage Vbias1 tracks the current Idet output from the envelope detector 120. Accordingly, it is required that the cutoff frequency of the node 110B1 as illustrated in FIG. 8B is higher than the frequency of the envelopes.

For the reasons as described above, as illustrated in FIG. 7, the buffer 150 is connected to the node Vb3, and the bias voltage Vbias1 is supplied from the output terminal 152 of the buffer 150 to the midpoint 12C at the secondary side of the input transformer 10.

Figure 9:
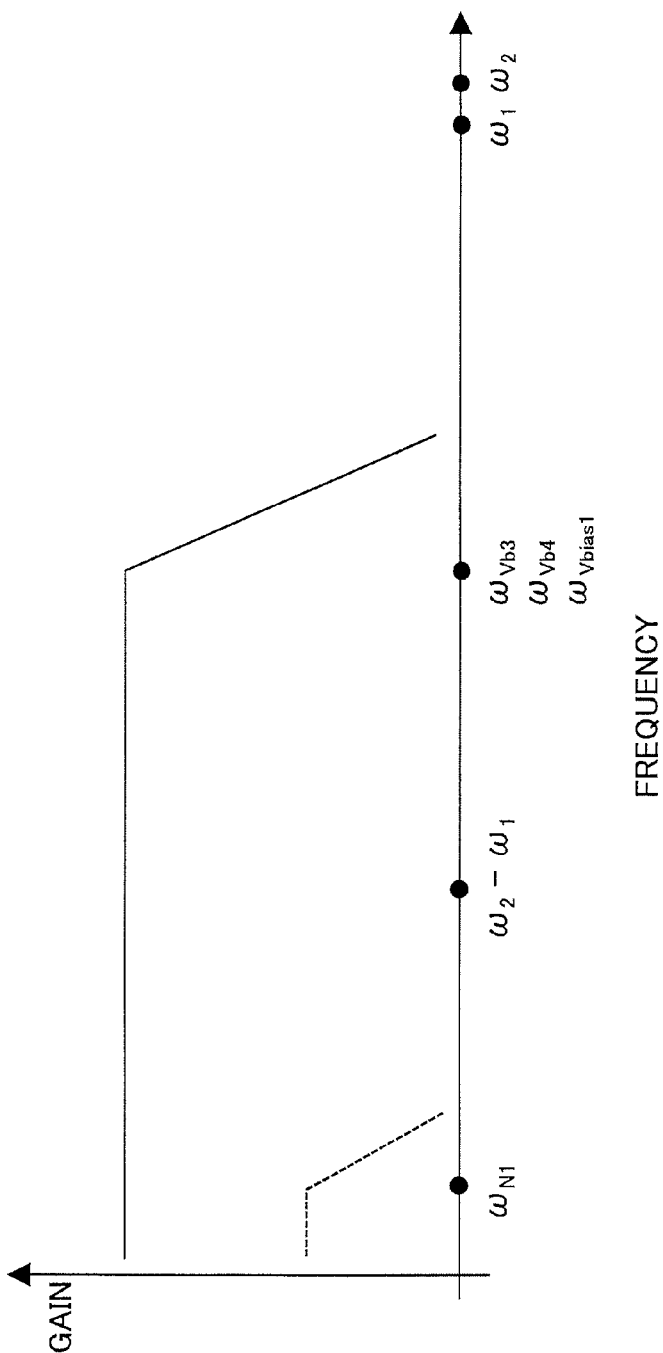
FIG. 9 is a diagram illustrating relationships of cutoff frequencies at nodes included in the amplifier according to the embodiment.

Accordingly, the envelope detector 120, the I-V converter 130 and the buffer 150 are preferably designed to have cutoff frequencies at the node Vb3, node Vb4 and output terminal 152 as illustrated in FIG. 7 that satisfy relationships as illustrated in FIG. 9.

FIG. 9 is a diagram illustrating the relationships of the cutoff frequencies at the nodes included in the amplifier 100 according to the embodiment.

The cutoff frequencies at the node Vb3, the node Vb4 at the output side of the Op-amp 151 included in the buffer 150, and the output terminal 152 are represented as $\omega_{Vb3}$, $\omega_{Vb4}$, $\omega_{Vbias1}$, respectively. A cutoff frequency of an RC filter included in the PA stage 40 (see FIG. 5) is represented as $\omega_{N1}$. Frequencies of the two-tone signals are represented as $\omega_1$ and $\omega_2$. Frequency of the envelopes is represented as $\omega_2-\omega_1$.

For the purpose of illustration, each frequency is represented by an angular frequency w.

The cutoff frequency $\omega_{Vb3}$ is represented as $1/(2\pi \times Rin \times Cop)$, where Rin is the input resistance of the I-V converter 130 and Cop is the parasitic capacitance of the Op-amp 151. The cutoff frequency $\omega_{Vb4}$ is represented as $1/(2\pi \times Rout1 \times Cin)$, where Rout1 is the output resistance of the Op-amp 151 and Cin is the parasitic capacitance of the inverter 153.

The cutoff frequency $\omega_{Vbias1}$ is represented as $1/(2\pi \times Rout2 \times Cdr)$, where Cdr is a capacitance of the gate capacity of the DR stage 20 and Rout2 is the output resistance of the inverter 153.

As illustrated in FIG. 9, it is preferable to set the cutoff frequencies $\omega_{Vb3}$, $\omega_{Vb4}$ and $\omega_{Vbias1}$ higher than the frequency $\omega_2-\omega_1$ of the envelopes. This is for the sake of enabling the controller 110 to output the bias voltage Vbias which tracks the current Idet output from the envelope detector 120.

It is preferable to set the cutoff frequency $\omega_{N1}$ of the RC filter included in the PA stage 40 (see FIG. 5) lower than the frequency $\omega_2-\omega_1$ of the envelopes. This is because the capacitance of the gate capacity of the PA stage 40 is very high, for example tens of pico farad (pF), and thereby it is difficult to charge the gate having the high capacitance while tracking the envelopes having the frequency of several MHz. Therefore, the cutoff frequency $\omega_{N1}$ of the PA stage 40 is set to a frequency much lower than the frequency $\omega_2-\omega_1$ of the envelopes.

Figure 10:
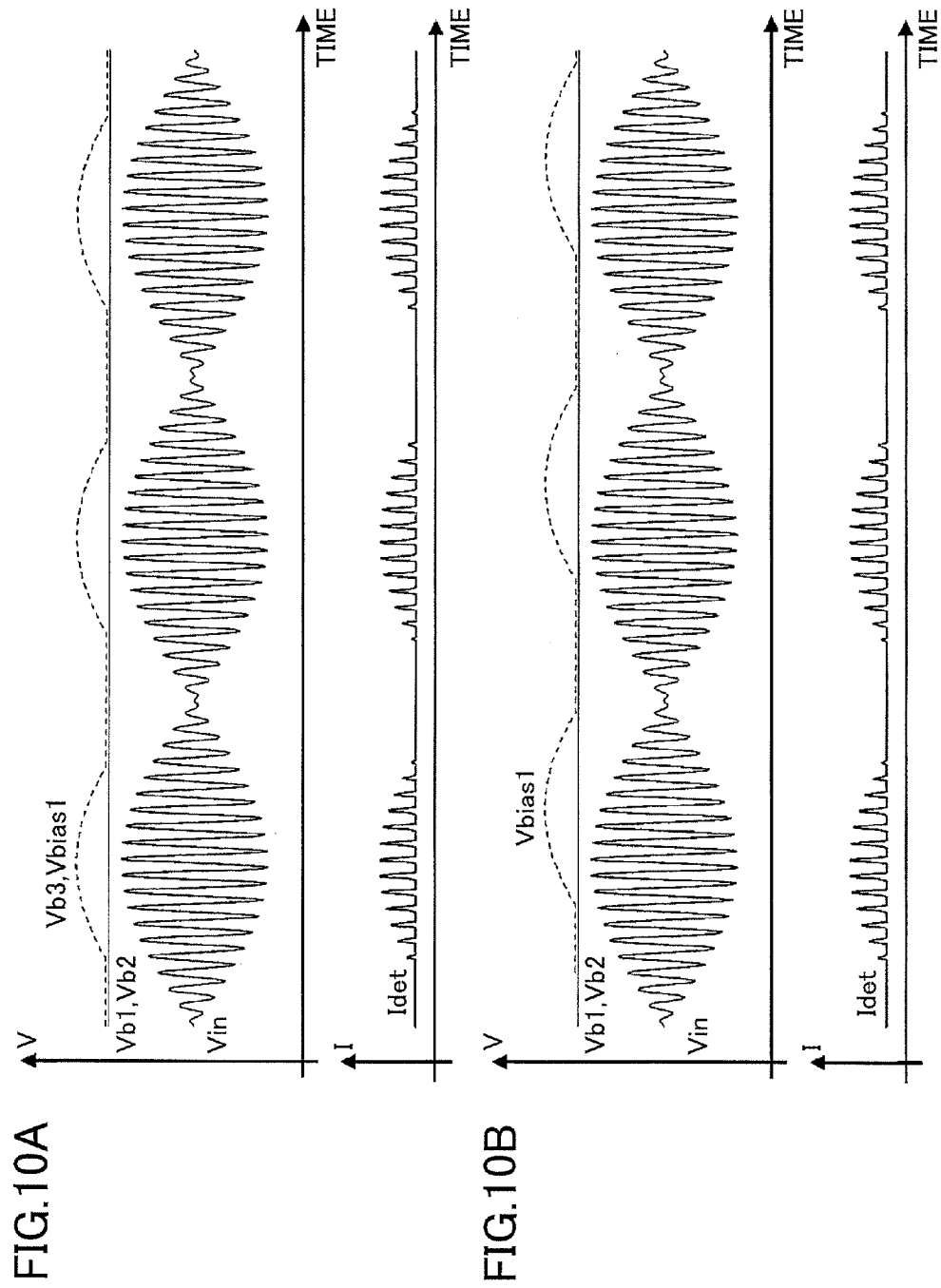
FIG. 10A is a diagram illustrating relationships between an input signal Vin, current Idet and a bias voltage Vbias1 obtained in the amplifier according to the embodiment.
FIG. 10B is a diagram illustrating relationships between an input signal Vin, current Idet and a bias voltage Vbias1 in a case where the bias voltage Vbias1 is not able to track the current Idet.

Next, the current Idet output from the envelope detector 120 will be described with reference to FIG. 10.

FIG. 10A is a diagram illustrating relationships between the input signal Vin, the current Idet and the bias voltage Vbias1 obtained in the amplifier 100 according to the embodiment. In the amplifier 100, the input signal Vin is input to the input terminal 101A, the current Idet is output from the envelope detector 120, and the bias voltage Vbias1 is output from the buffer 150.

FIG. 10B is a diagram illustrating relationships between the input signal Vin, the current Idet and the bias voltage Vbias1 in a case where the bias voltage Vbias1 is not able to track the current Idet, i.e. the bias voltage Vbias1 is delayed with respect to the current Idet. FIG. 10B is illustrated for purpose of comparison. The relationships between the input signal Vin, the current Idet and the bias voltage Vbias1 as illustrated in FIG. 10B are obtained in a case where the controller 110B, as illustrated in FIG. 8B, which does not include the buffer 150 (see FIG. 7) is used instead of the controller 110 as illustrated in FIG. 7.

As illustrated in FIG. 10A, the voltage Vb3 is given as a voltage which corresponds to the current Idet. The current Idet flows when the amplitude of the input signal Vin is as large as a certain level, i.e. greater than or equal to a designated amplitude. This operation is realized by causing the transistor Mp2 of the envelope detector 120 to function as a class C amplifier. The amplitude of the input signal Vin becomes larger at the anti-nodes (see FIG. 6) of the envelopes and becomes smaller at the nodes (see FIG. 6) of the envelopes.

Since the bias voltage Vbias1 tracks the current Idet in FIG. 10A, the bias voltage Vbias1 and the voltage Vb3 fluctuate with the same amplitude and phase relative to each other. The voltages Vb1 and Vb2 at the nodes Vb1 and Vb2 are equal to the minimum voltage of the voltage Vb3 which is obtained during a period of time when the current Idet does not flow. Since the circuit as illustrated in FIG. 7 has a symmetric property, the voltage Vb3 during the period of time when the current Idet does not flow becomes equal to the voltage Vb2 at the node Vb2.

On the contrary, in FIG. 10B, the bias voltage Vbias1 is delayed with respect to the current Idet, i.e. the bias voltage Vbias1 is not able to track the current Idet. In a case where the controller 110B as illustrated in FIG. 8B is used instead of the controller 110 as illustrated in FIG. 7, the parasitic capacitance at the node Vb3 becomes higher, and the cutoff frequency at the node Vb3 becomes lower than the frequency of the envelopes. As a result, the bias voltage Vbias1 is not able to track the current Idet.

As described above, it is possible to obtain the bias voltage Vbias1 which tracks the current Idet as illustrated in FIG. 10A by disposing the buffer 150.

In a case where the buffer 150 is not disposed, i.e. in a case where the controller 110B (see FIG. 8B) is used instead of the controller 110 (see FIG. 7), the signal levels of the two IM3 signals may differ greatly, i.e. may split. Next, the split of the two IM3 signals will be described with reference to FIG. 11.

Figure 11:
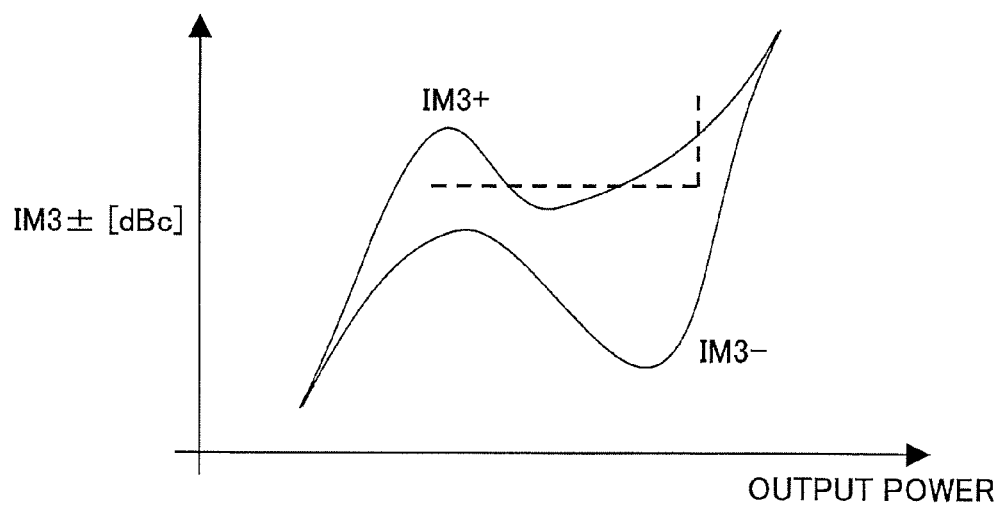
FIG. 11 is a diagram illustrating a case where the two IM3 signals split from each other.

FIG. 11 is a diagram illustrating a case where the two IM3 signals split from each other. In FIG. 11, the two IM3 signals are indicated as a signal IM3+ and a signal IM3−. The signal IM3+ is a component of the two IM3 signals having a frequency of $2\omega_2-\omega_1$, and a signal IM3− is a component of the two IM3 signals having a frequency of $2\omega_1-\omega_2$.

In a case where the two IM3 signals IM3+ and IM3− are caused to split, either one of the two IM3 signals IM3+ and IM3− may exceed the maximum allowable level indicated by a dashed line. In such a case, the distortion of the output signal of the amplifier 100 is not reduced enough.

Therefore, it is necessary to make the cutoff frequencies at the node Vb3, the node Vb4 and the output terminal 152 higher than the frequency of the envelopes so that the bias voltage Vbias1 can track the current Idet. In order to set the cutoff frequencies to such high levels, the use of the buffer 150 is very effective.

In a case where designing the controller 110 as described above, parameters such as the sizes (particularly, sizes of the transistors), the resistances, capacitances and the like of the configuration elements included in the controller 110 may be determined so that the designated amplitude value of the envelopes and the cutoff frequencies are optimized and the operation as described is achieved. The designated amplitude value of the envelopes determines the current Idet value.

Next, the controller 160 will be described with reference to FIG. 12.

Figure 12:
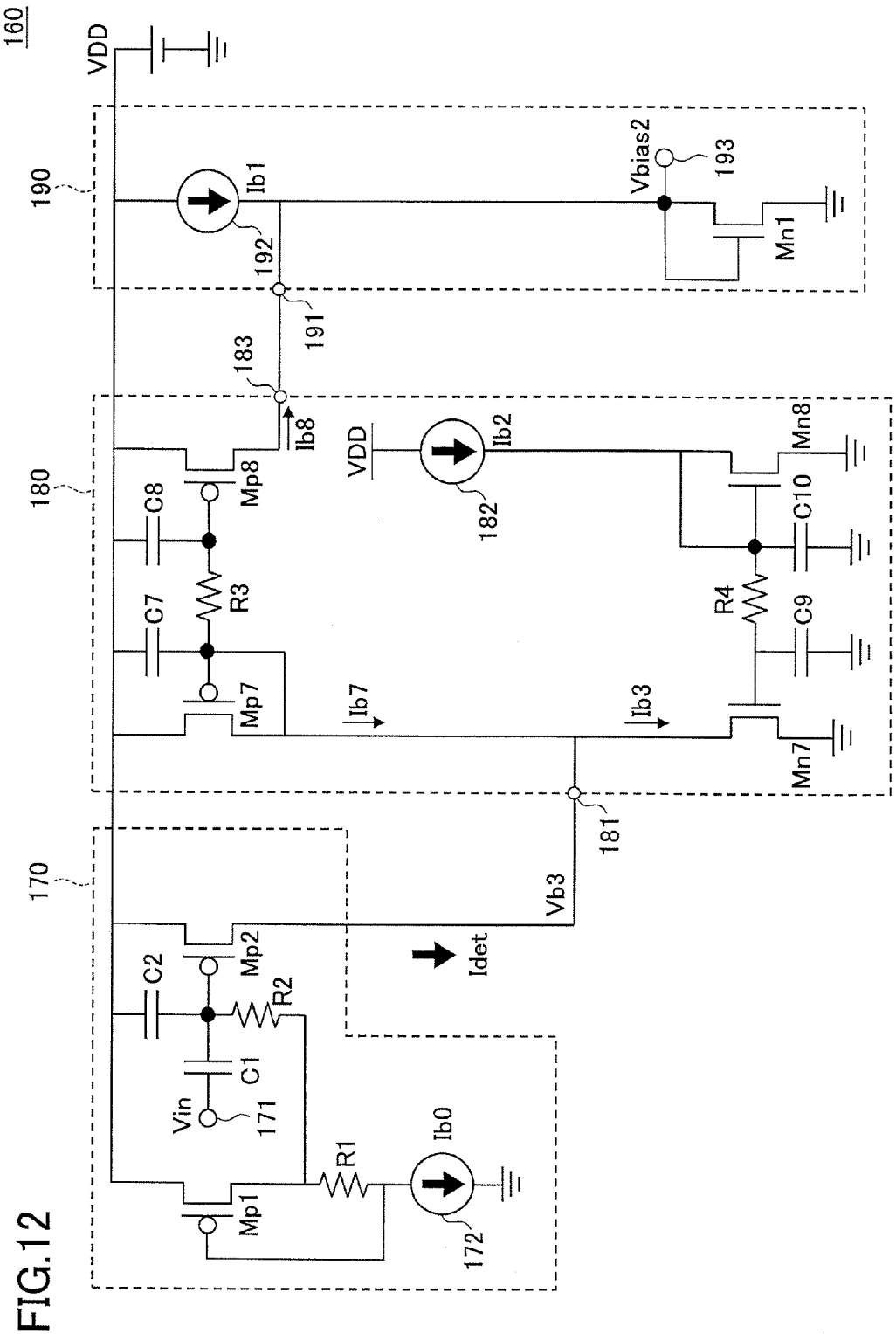
FIG. 12 is a diagram illustrating a controller included in the amplifier of the embodiment.

FIG. 12 is a diagram illustrating the controller 160 included in the amplifier 100 of the embodiment.

The controller 160 includes an envelope detector 170, a current-addition circuit 180 and a core bias circuit 190. The envelope detector 170 and the core bias circuit 190 have circuit configurations similar to those of the envelope detector 120 and core bias circuit 140 as illustrated in FIG. 7, respectively.

The envelope detector 170 includes an input terminal 171, a transistor Mp1, a resistor R1, a current source 172, capacitors C1 and C2, a resistor R2 and a transistor Mp2. The input terminal 171, the transistor Mp1, the resistor R1, the current source 172, the capacitors C1 and C2, the resistor R2 and the transistor Mp2 of the envelope detector 170 are similar to the input terminal 121, the transistor Mp1, the resistor R1, the current source 122, the capacitors C1 and C2, the resistor R2 and the transistor Mp2 of the envelope detector 120.

The envelope detector 170 outputs the current Idet in a case where an amplitude of envelopes of the input signal Vin input from input terminal 101A to the input terminal 171 is greater than or equal to a designated amplitude. The envelope detector 170 is one example of the second envelope detector.

The current-addition circuit 180 includes an input terminal 181, a current source 182, an output terminal 183, transistors Mp7, Mp8, Mn7 and Mn8, capacitors C7, C8, C9 and C10, and resistors R3 and R4.

The input terminal 181 is connected to a drain of the transistor Mp2 of the envelope detector 170 via a node Vb3. The current Idet is input from the envelope detector 170 to the input terminal 181. An input resistance at the input terminal 181 as viewed from the node Vb3 is determined by a combined resistance of resistances of the output resistors of the transistors Mp7 and Mn7. Since the transistors Mp7 and Mn7 are connected parallel to each other with respect to the input terminal 181, the input resistance at the input terminal 181 as viewed from the node Vb3 is represented by the combined resistance of a parallel circuit in which the output resistor of the transistor Mp7 and the output resistor of the transistor Mn7 are connected in parallel.

The transistor Mp7 is a PMOS transistor. With regard to a source, a drain and a gate of the transistor Mp7, the source is connected to the direct-current power source VDD, the drain is connected to the input terminal 181, a drain of the transistor Mn7 and the gate.

The gate of the transistor Mp7 is connected to a gate of the transistor Mp8 via the resistor R3. A capacitor C7 is connected between the gate and the source of the transistor Mp7. The transistor Mp7 is diode-connected to the transistor Mn7.

With respect to a source and a drain of the transistor Mp8, the source is connected to the direct-current power source VDD and the drain is connected to the output terminal 183. The gate of the transistor Mp8 is connected to the gate of the transistor Mp8 via the resistor R3. A capacitor C8 is connected between the gate and the source of the transistor Mp8.

The resistor R3 and the capacitors C7 and C8 constitute a low-pass filter. A cutoff frequency of the low-pass filter is set to a frequency much lower than the frequency of the envelopes. Therefore, the low-pass filter filters out an alternating current component included in the signal input from the gate of the transistor Mp7 and outputs only a direct current component of the signal.

The low-pass filter may not include the capacitor C7. Whether the low-pass filter includes the capacitor C7 may be determined in accordance with operating characteristics and the like of the current-addition circuit 180.

An input terminal of the current source 182 is connected to the direct-current power source VDD and an output terminal of the current source 182 is connected to a drain and a gate of the transistor Mn8. The current source 182 is a constant source which output a direct current Ib2.

The drain of the transistor Mn7 is connected to the input terminal 181 and the drain and the gate of the transistor Mp7. The gate of the transistor Mn7 is connected to the gate and the drain of the transistor Mn8 via the resistor R4.

The resistor R4 is connected between the gate of the transistor Mn7 and the gate of the transistor Mn8. First ends of the capacitors C9 and C10 are connected on both sides of the resistor R4, and the other ends of the capacitors C9 and C10 are connected to a ground potential point, i.e. grounded. The resistor R4 and the capacitors C9 and C10 constitute a π(pi)-shaped low-pass filter. A cutoff frequency of the low-pass filter may be set to a frequency which can absorb a voltage fluctuation which occurs between the gates of the transistors Mn7 and Mn8

Since the transistors Mn8 and Mn7 constitute a current mirror circuit, the current Ib2 flowing through the transistor Mn8 is copied to the transistor Mn7. Accordingly, a current flowing through the transistor Mn7 is fixed to a current Ib3 corresponding to the current Ib2. A current value of the current Ib3 is determined by a size ratio of the transistors Mn8 and Mn7. Hence, a ratio of current values of the currents Ib2 and Ib3 is determined by the size ratio of the transistors Mn8 and Mn7.

The current value of the current Idet input from the envelope detector 170 to the current-addition circuit 180 via the input terminal 181 becomes zero in a case where the amplitude of the envelopes of the input signal Vin input to the envelope detector 170 is less than the designated amplitude. The current value of the current Idet increases in accordance with the amplitude of the envelopes, if the amplitude is greater than or equal to the designated amplitude.

Accordingly, the current value of the current Idet becomes a current value corresponding to the amplitude of the envelopes, if the amplitude of the envelopes is greater than or equal to the designated amplitude. The current value of the current Idet becomes zero, if the amplitude of the envelopes is less than the designated amplitude.

Therefore, only a current Ib7 flows from the transistor Mp7 to the transistor Mn7 of the current-addition circuit 180, if the amplitude of the envelopes of the input signal Vin is less than the designated amplitude.

If the amplitude of the envelopes of the input signal Vin is greater than or equal to the designated amplitude, the current Idet corresponding to the amplitude of the envelopes flows from the transistor Mp2 of the envelope detector 170 to the transistor Mn7 of the current-addition circuit 180. Accordingly, the current Ib7 decreases in accordance with the current value of the current Idet.

In a case where the amplitude of the envelopes of the input signal Vin is less than the designated amplitude, the current Ib7 corresponding to the current Ib2 output from the current source 182 flows into the transistor Mp7. In this case, the current Ib7 is equal to the current Ib3.

In a case where the amplitude of the envelopes of the input signal Vin is greater than or equal to the designated amplitude, the current Ib7 flowing into the transistor Mp7 decreases by an amount of the current Idet output from the envelope detector 170 in accordance with the amplitude of the envelopes. In this case, the current Ib7 is Ib3-Idet.

A copy current Ib8 flows through the transistor Mp8 which constitutes the current mirror circuit with the transistor Mp7. A current value of the current Ib8 is determined in accordance with a size ratio of the transistors Mp7 and Mp8. The current Ib8 flows from transistor Mp8 to the output terminal 183.

Since the current Idet of the envelope detector 170 becomes zero in a case where the amplitude of the envelopes of the input signal Vin is less than the designated amplitude, the current Ib8 is obtained by multiplying the current Ib3 by the size ratio of the transistors Mp7 and Mp8. In this case, the current Ib8 corresponds to the current Ib2 of the current source 182.

In a case where the amplitude of the envelopes of the input signal Vin is less than the designated amplitude, the current Ib8 becomes a constant current corresponding to the current Ib2.

In a case where the amplitude of the envelopes of the input signal Vin is greater than or equal to the designated amplitude, the current Ib8 decreases by an amount of the current Idet output from the envelope detector 170 in accordance with the amplitude of the envelopes. The current Ib7 decreases by an amount of the current Idet. Accordingly, the current Ib7 becomes Ib3-Idet.

If the current Idet fluctuates in an alternating fashion, the low-pass filter constituted of the resistor R3 and the capacitors C7 and C8 filters the alternating current component. Accordingly, a direct voltage is input to the gate of the transistor Mp8.

In a case where the amplitude of the envelopes of the input signal Vin is greater than or equal to the designated amplitude, the current Ib8 becomes a DC current obtained by subtracting a DC current corresponding to an increase amount of the current Idet from the current Ib3 corresponding to the current Ib2.

The core bias circuit 190 includes an input terminal 191, a current source 192, a transistor Mn1 and an output terminal 193. The current source 192 and the transistor Mn1 are similar to the current source 141 and the transistor Mn1 of the core bias circuit 140 as illustrated in FIG. 7, respectively. The input terminal 191 which is connected between an output terminal of the current source 192 and a drain of the transistor Mn1 is connected to the output terminal 183 of the current-addition circuit 180.

The core bias circuit 190 outputs the bias voltage Vbias2 to the output terminal 193. The bias voltage Vbias2 corresponds to a combined current (Ib1+Ib8) which is obtained by combining a current Ib1 output from the current source 192 and the current Ib8 input to the input terminal 191 from the current-addition circuit 180.

The current Ib8 is the constant current corresponding to the current Ib2 output from the current source 182 in a case where the amplitude of the envelopes of the input signal Vin is less than the designated amplitude.

The current Ib8 is the DC current obtained by subtracting the current corresponding to the increase amount of the current Idet from the current Ib3 corresponding to the current Ib2 in a case where the amplitude of the envelopes of the input signal Vin is greater than or equal to the designated amplitude.

Accordingly, the bias voltage Vbias2 is a constant voltage determined by the current (Ib1+Ib8) obtained by combining the current Ib1 output from the current source 192 and the current Ib8 corresponding to the current Ib2 output from the current source 182 in a case where the amplitude of the envelopes of the input signal Vin is less than the designated amplitude.

The bias voltage Vbias2 is a DC voltage which is lower than the constant voltage by a voltage corresponding to the increase amount of the current Idet in a case where the amplitude of the envelopes of the input signal Vin is greater than or equal to the designated amplitude.

Accordingly, the bias voltage Vbias2 becomes higher in a case where the amplitude of the envelopes of the input signal Vin is less than the designated amplitude than in a case where the amplitude of the envelopes of the input signal Vin is greater than or equal to the designated amplitude. The bias voltage Vbias2 is supplied to the midpoint 32C located at the secondary side of the interstage transformer 30 from the output terminal 193 of the core bias circuit 190 included in the controller 160.

The current-addition circuit 180 and the core bias circuit 190, as a whole, are one example of a second converter.

Since the amplitude of the envelopes of the input signal is small in the small-signal operating area, it is unlikely that the amplitude of the envelopes becomes greater than the designated amplitude. On the contrary, if the amplitude of the envelopes of the input signal is large in the large-signal operating area, it is likely that the amplitude of the envelopes becomes greater than the designated amplitude.

Accordingly, the bias voltage Vbias2 becomes a higher DC voltage in the small-signal operating area, and the bias voltage Vbias2 becomes a lower DC voltage in the large-signal operating area.

According to the present embodiment, the amplifier 100 controls the gain characteristics of the PA stage 40 by utilizing the bias voltage Vbias2 output from the controller 160.

Hereinafter, operations of the PA stage 40 will be described with reference to FIG. 13.

FIG. 13A is a diagram illustrating relationships between the input signal Vin, the current Idet and the bias voltage Vbias2 obtained in the amplifier 100 according to the embodiment in the large-signal operation mode. In the amplifier 100, the input signal Vin is input to the input terminal 101A, the current Idet is output from the envelope detector 170, and the bias voltage Vbias2 is output from the core bias circuit 19C.

FIG. 13B is a diagram illustrating relationships between the input signal Vin, the current Idet and the bias voltage Vbias2 obtained in the amplifier 100 according to the embodiment in the small-signal operation mode.

In the large-signal operation mode, the amplitude (the amplitudes at the anti-nodes) obtained between the envelopes of the input signal Vin becomes greater as illustrated in FIG. 13A. In the small-signal operation mode, the amplitude (the amplitudes at the anti-nodes) obtained between the envelopes of the input signal Vin becomes smaller as illustrated in FIG. 13B.

As illustrated in FIG. 13A, the voltage Vb3 is given as a voltage corresponding to the current Idet. The current Idet flows when the amplitude of the input signal Vin is as large as a certain level, i.e. greater than or equal to the designated amplitude. This operation is realized by causing the transistor Mp2 of the envelope detector 170 to function as the class C amplifier. The amplitude of the input signal Vin becomes larger at the anti-nodes (see FIG. 6) of the envelopes and becomes smaller at the nodes (see FIG. 6) of the envelopes. The amplitude of the input signal Vin corresponds to the amplitude of the baseband signal.

Accordingly, the bias voltage Vbias2 is a DC voltage which is decreased by a voltage corresponding to the increase amount of the current Idet in the large-signal operation mode.

On the contrary, as illustrated in FIG. 13B, the amplitude of the envelopes of the input signal Vin in the small-signal operation mode is smaller than the amplitude of the envelopes of the input signal Vin in the large-signal operation mode as illustrated in FIG. 13A.

As illustrated in FIG. 13B, a peak value of the current Idet in the small-signal operation mode is lower than that of the large-signal operation mode as illustrated in FIG. 13A. Although FIG. 13B illustrates a case where the current Idet flows, the current Idet does not flow if the amplitude of the envelopes of the input signal Vin does not exceed the designated amplitude in the small-signal operation mode.

Accordingly, the bias voltage Vbias2 in the small-signal operation mode becomes higher than the bias voltage Vbias2 in the large-signal operation mode as illustrated in FIG. 13A.

As described above, the controller 160 can make the bias voltage Vbias2 in the small-signal operation mode higher than the bias voltage Vbias2 in the large-signal operation mode.

Accordingly, it is possible to correct the output power-gain characteristics of the PA stage 40 in the small-signal operating area so that the output power-gain characteristics become closer to constant gain characteristics in relation to the output power by utilizing the controller 160. This means that it is possible to correct the output power-gain characteristics in which the gain increases gradually in relation to the output power in the small-signal operating area as illustrated in FIG. 4B to the output power-gain characteristics in which the gain is constant in relation to the output power.

The voltage value of the bias voltage Vbias2 is determined by the characteristics of the current sources 182 and 192, the transistors Mn7, Mn7, Mp7 and Mp8, the low-pass filter (including C7, C8, R3), and the low-pass filter (including C9, C10, R4) and the like and the current Idet corresponding to the amplitude of the envelopes. Accordingly, the parameters such as the sizes (particularly, sizes of the transistors), the resistances, the capacitances and the like of the configuration elements included in the controller 160 may be determined so that the gain characteristics of the PA stage 40 in the small-signal operating area is improved and the operating characteristics of the PA stage 40 in the large-signal operating area are improved.

In the following, the operation of the amplifier 100 according to the embodiment will be described with reference to FIGS. 14 and 15.

In the amplifier 100 according to the present embodiment, the controllers 110 and 160 control the bias voltages Vbias1 and Vbias2 as described above. However, the controller 160 may not control the bias voltage Vbias2. For example, in a case where the output power-gain characteristics of the PA stage 40 in the small-signal operation mode do not pose a problem for the operation of the amplifier 100, the amplifier 100 may include the bias circuit 70 (see FIG. 3) according to the comparative example instead of the controller 160.

Figure 14A:
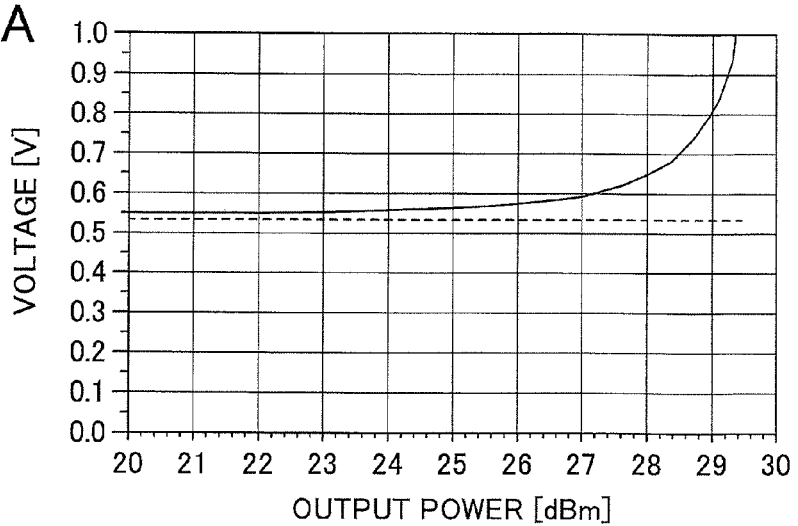
FIG. 14A is a diagram illustrating operating characteristics of the amplifier according to the present embodiment.
Figure 14B:
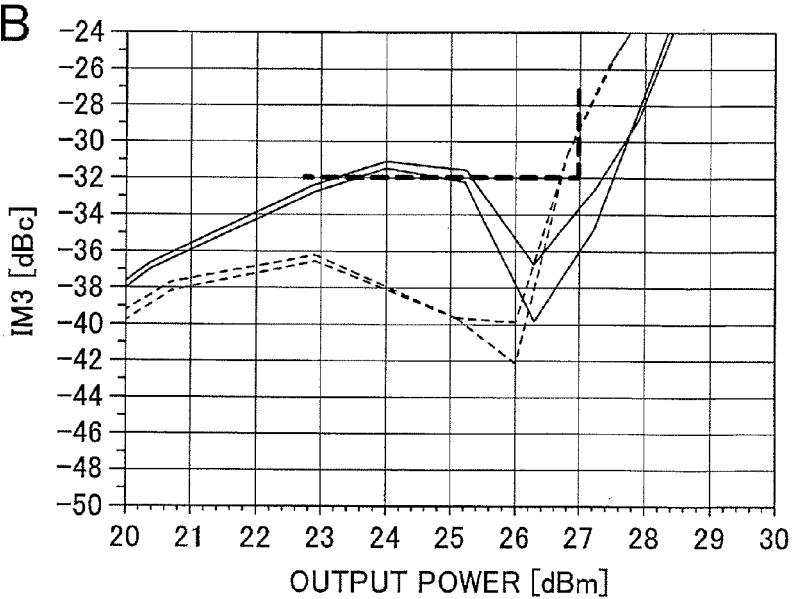
FIG. 14B is a diagram illustrating operating characteristics of the amplifier according to the present embodiment.
Figure 14C:
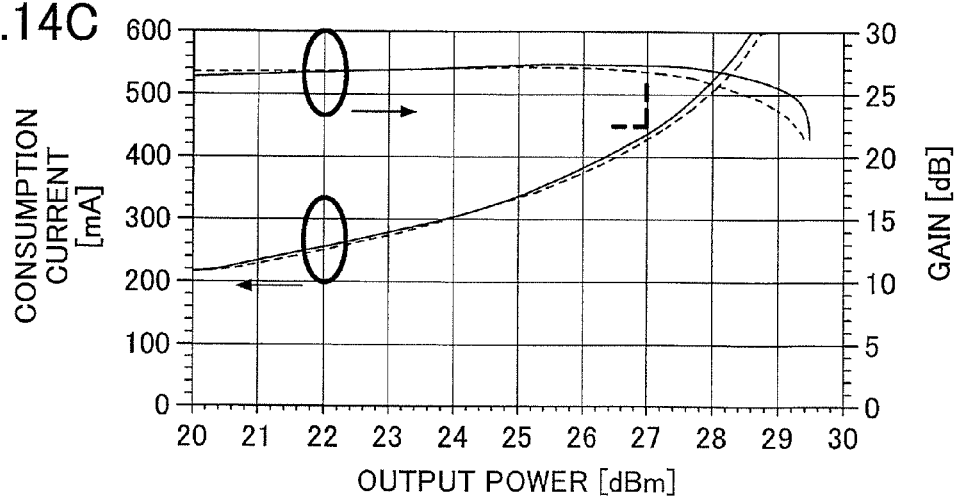
FIG. 14C is a diagram illustrating operating characteristics of the amplifier according to the present embodiment.
Figure 15A:
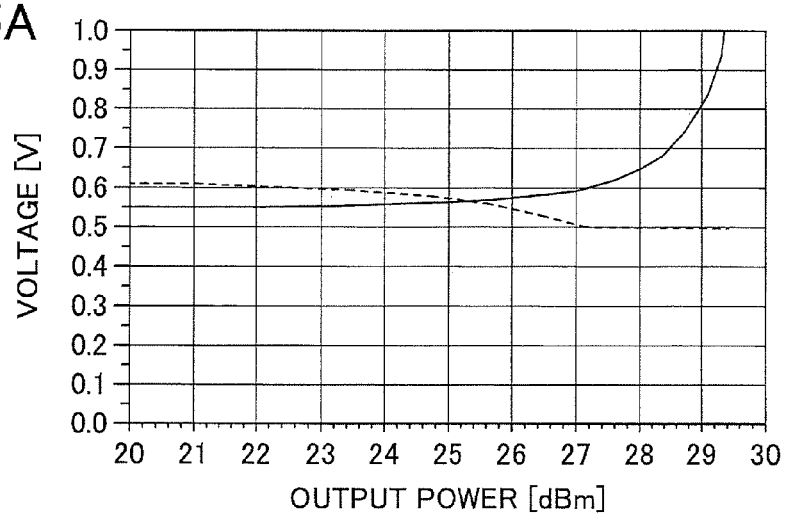
FIG. 15A is a diagram illustrating operating characteristics of the amplifier according to the present embodiment.
Figure 15B:
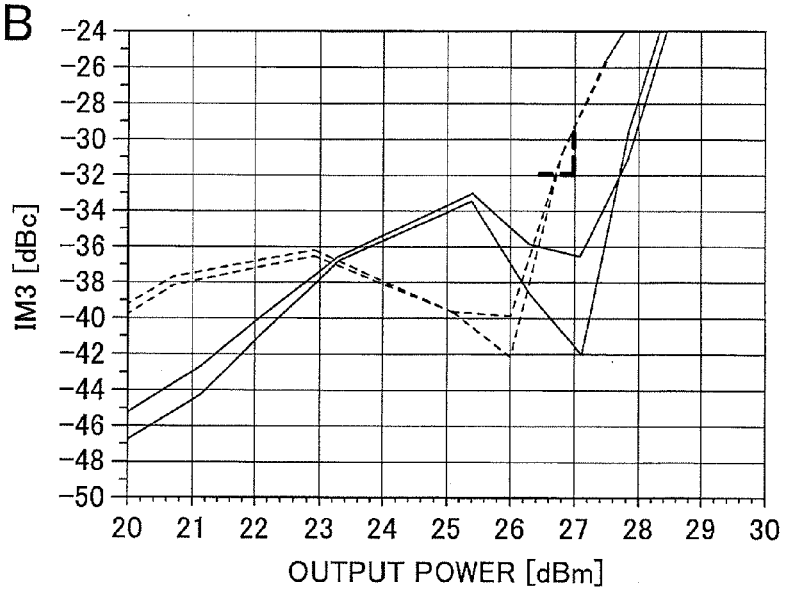
FIG. 15B is a diagram illustrating operating characteristics of the amplifier according to the present embodiment.

FIGS. 14A, 14B, 14C, 15A, 15B and 15C are diagrams illustrating operating characteristics of the amplifier 100 according to the present embodiment. FIGS. 14A and 14B illustrate the operating characteristics of the amplifier 100 which includes the bias circuit 70 (see FIG. 3) of the comparative example instead of the controller 160. FIGS. 15A and 15B illustrate the operating characteristics of the amplifier 100 which includes the controllers 110 and 160 that control the bias voltages Vbias1 and Vbias2, respectively.

In FIG. 14A, a solid line indicates the bias voltage Vbias1 and a dashed line indicates the bias voltage Vbias2. In this case, the bias voltage Vbias1 is output from the controller 110 and the bias voltage Vbias2 is output from the bias circuit 70.

Accordingly, the bias voltage Vbias1 increases as the output power increases. Particularly, the bias voltage Vbias1 increases exponentially in an operating area where the output power is greater than or equal to 26.0 dBm.

On the contrary, the bias voltage Vbias2 is constant as the output power increases. This is because the bias voltage Vbias2 indicated by the dashed line in FIG. 14A is output from the bias circuit 70 of the comparative example.

In FIG. 14B, fine solid lines indicate the IM3 signals of the amplifier 100. Fine dashed lines indicate the IM3 signals of the amplifier 1 (see FIG. 3) according to the comparative example. The characteristics indicated by the fine dashed lines are the same as the characteristics indicated by the fine solid lines as illustrated in FIG. 4A.

As the controller 110 controls the bias voltage Vbias1 as illustrated in FIG. 14A, the IM3 signal is reduced at 27.0 dBm, i.e. the operating point as illustrated in FIG. 14B.

In the operating area where the output power is lower than 27.0 dBm, i.e. the operating point, the IM3 signals are increased compared with the comparative example. However, the IM3 signals at the operating point are reduced compared with the comparative example. Accordingly, it is perceived that the distortion of output signals of the amplifier 100 are reduced and the improved characteristics of the amplifier 100 is obtained.

In FIG. 14C, solid lines indicate the consumption current and the gain of the amplifier 100 and dashed lines indicate the consumption current and the gain of the amplifier 1 according to the comparative example.

The consumption current of the amplifier 100 is reduced at the operating area where the output power is greater than or equal to 26.0 dBm compared with the amplifier 1 of the comparative example. The gain characteristics of the amplifier 100 become closer to constant gain characteristics in relation to the output power at the operating area where the output power is greater than or equal to 26.0 dBm than the amplifier 1 of the comparative example. The gain characteristics of the amplifier 100 is improved much more than the amplifier 1.

Accordingly, it is possible to improve the output signal-gain characteristics of the amplifier 100 which includes the bias circuit 70 instead of the controller 160 so that the output power-gain characteristics become closer to constant gain characteristics in relation to the output power compared with the amplifier 1 of the comparative example.

In the following, the operation of the amplifier 100 in which the controllers 110 and 160 control the bias voltages Vbias1 and Vbias2 will be described with reference to FIG. 15.

In FIG. 15A, a solid line indicates the bias voltage Vbias1 and a dashed line indicates the bias voltage Vbias2. The bias voltage Vbias1 is output from the controller 110 and the bias voltage Vbias2 is output from the controller 160.

The bias voltage Vbias1 increases as the output power increases. Particularly, the bias voltage Vbias1 increases exponentially in an operating area where the output power is greater than or equal to 26.0 dBm.

The bias voltage Vbias2 remains at a certain high level at the operating area where the output power is relatively low and decreases as the output power increases. Hence, the bias voltage Vbias2 is high in the small-signal operation mode and is low in the large-signal operation mode. This is the characteristic of the bias voltage Vbias2.

In FIG. 15B, fine solid lines indicate the IM3 signals of the amplifier 100. Fine dashed lines indicate the IM3 signals of the amplifier 1 (see FIG. 3) according to the comparative example. The characteristics indicated by the fine dashed lines are the same as the characteristics indicated by the fine solid lines as illustrated in FIG. 4A.

As illustrated in FIG. 15B, the IM3 signals are reduced greatly and become lower than the maximum allowable level. These effects are obtained by causing the controllers 110 and 160 to control the bias voltages Vbias1 and Vbias2 as illustrated in FIG. 15A.

Figure 15C:
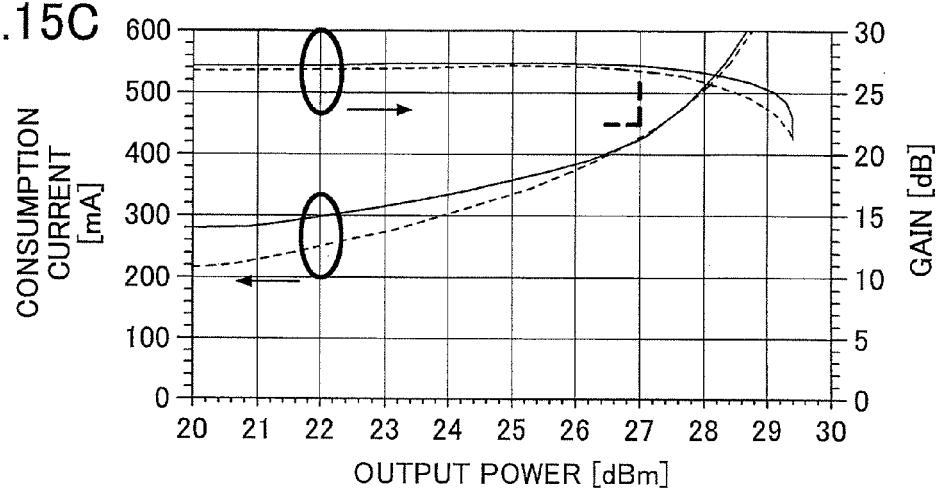
FIG. 15C is a diagram illustrating operating characteristics of the amplifier according to the present embodiment.

In FIG. 15C, solid lines indicate the consumption current and the gain of the amplifier 100 and dashed lines indicate the consumption current and the gain of the amplifier 1 according to the comparative example.

Although the consumption current of the amplifier 100 is slightly increased in the operating area where the output power is less than or equal to 26.0 dBm compared with the amplifier 1 of the comparative example, the consumption current remains at a level which is much lower than the maximum allowable level. The consumption current is reduced at the operating area where the output power is greater than or equal to 28.0 dBm compared with the amplifier 1 of the comparative example.

The gain of the amplifier 100 is increased at the operating area where the output power is less than or equal to 24.0 dBm. The gain characteristics become closer to constant gain characteristics in relation to the output power. The gain characteristics become closer to constant characteristics even in the large-signal operating area where the output power is greater than or equal to 26.0 dBm compared with the amplifier 1 of the comparative example.

As described above, according to the amplifier 100 including the controllers 110 and 160, it is possible to improve the output power-gain characteristics so that the output power-gain characteristics become closer to constant gain characteristics in relation to the output power compared with the amplifier 1 of the comparative example.

The improvement of the gain in the small-signal operating area is obtained by causing the controller 160 to increase the bias voltage Vbias2 input to the gate of the PA stage 40 in the small-signal operating area.

The improve of the gain in the large-signal operating area is obtained by causing the controller 110 to increase the bias voltage Vbias1 input to the gate of the DR stage 20 in the large-signal operating area.

According to the present embodiment, it is possible to provide the amplifier 100 which improves the output power-gain characteristics so that the output power-gain characteristics become closer to constant gain characteristics in relation to the output power.

The reason why the amplifier 100 causes the controller 110 to adjust the bias voltage Vbias1 which is a gate voltage input to the DR stage 20 is as follows. The DR stage 20 has smaller size and smaller gate capacitance than the PA stage 40. Therefore, it is easier to perform the driving control of the DR stage 20 than the PA stage 40.

The amplifier 100 realizes a bias circuit configuration of the controller 110 which provides a high cutoff frequency that can track the envelopes and causes the DR stage 20 to adjust the output power-gain characteristics in the large-signal operation mode. The size of the DR stage 20 is about a half to one-tenth of that of the PA stage 40, for example.

Since the PA stage 40 has the great gate capacitance as described above, the controller 160 converts the current Idet output from the envelope detector 170 to the DC current component by utilizing the low-pass filters and the like in the process of generating the bias voltage Vbias2 performed at the current-addition circuit 180 and the core bias circuit 190. The amplifier 100 improves the output power-gain characteristics in the small-signal operating area by causing the controller 160 to generate the bias voltage Vbias2.

According to the embodiment as described above, the input transformer 10 transforms the single-ended input signal to the differential signals. In a case where differential input signals are input to the input transformer 10, the input transformer 10 includes two primary windings corresponding to the differential input signals.

According to the embodiment as described above, the amplifier 100 includes the differential amplifier stage, i.e. the DR stage 20 and the PA stage 40, and causes the controller 110 to control the bias voltage Vbias1 supplied to the DR stage 20 so that the output power-gain characteristics of the DR stage 20 in the large-signal operating area become closer to constant gain characteristics in relation to the output power.

If the differential amplifier stage includes more than three stages, the amplifier 100 may control the bias voltage of the differential amplifier stage(s) located between the first stage and the final stage so that the output power-gain characteristics of the differential amplifier stage(s) in the large-signal operating area become closer to constant characteristics in a manner similar to that of the DR stage 20.

If the differential amplifier stage includes more than four stages, the amplifier 100 may control the bias voltage of the differential amplifier stages other than the final stage so that the output power-gain characteristics of the differential amplifier stages in the large-signal operating area become closer to constant characteristics in a manner similar to that of the DR stage 20.

The circuit configurations of the low-pass filters, the sizes of the transistors and the like may be changed in various ways.

So far, the preferred embodiments and modification of the amplifier are described. However, the invention is not limited to those specifically described embodiments and the modification thereof, and various modifications and alterations may be made within the scope of the inventions described in the claims.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of superiority or inferiority of the invention.

Although the embodiments of the present invention have been described in detail, it should be understood that the various changes, substitutions, and alterations could be made hereto without departing from the spirit and scope of the invention.

What is claimed is:

1. An amplifier comprising:
   a first transformer configured to have a first primary side and a first secondary side, to transform an input signal input to the first primary side to first differential signals, and to output the first differential signals from the first secondary side;
   a first differential amplifier configured to have an input side and an output side, the input side being coupled to the first secondary side;
   a second transformer configured to have a second primary side and a second secondary side, the second primary side being coupled to the output side of the first differential amplifier;
   a second differential amplifier coupled to the second secondary side;
   a third transformer configured to transform second differential signals output from the second differential amplifier to a single-ended output signal; and
   a first bias circuit configured to supply a first bias voltage to a first secondary coil of the first transformer,
   wherein the first bias circuit is configured to set the first bias voltage to a voltage greater than or equal to a first voltage on the basis of the input signal in a first operating area where power of the output signal is greater than or equal to a first power so that power-gain characteristics of the output signal become closer to characteristics where gain of the output signal becomes constant in relation to power of the output signal.

2. The amplifier of claim 1, wherein the input signal is a combined signal in which a baseband signal and a signal at a first frequency are combined, and
   wherein the first bias circuit is configured to set the first bias voltage to a voltage greater than or equal to the first voltage in accordance with an amplitude of envelopes of the input signal in the first operating area.

3. The amplifier of claim 2, wherein the first bias circuit includes:
   a first envelope detector configured to output current corresponding to the amplitude of the envelopes in a case where the amplitude of the envelopes is greater than or equal to a first amplitude, and
   a first converter configured to convert the current output from the first envelope detector to the first bias voltage.

4. The amplifier of claim 3, wherein the first envelope detector includes a transistor which outputs the current by operating as a class C amplifier in accordance with an amplitude of the input signal.

5. The amplifier of claim 3, wherein the first bias circuit further includes a buffer configured to set a cutoff frequency at an output node of the first converter to be a frequency higher than a cutoff frequency of the envelopes, the first bias voltage being output from the output node.

6. The amplifier of claim 4, wherein the first bias circuit further includes a buffer configured to set a cutoff frequency at an output node of the first converter to a frequency higher than a cutoff frequency of the envelopes, the first bias voltage being output from the output node.

7. The amplifier of claim 5, wherein the buffer includes:
   an Op-amp configured to have a first input terminal, a second input terminal and an output terminal, the first input terminal being coupled to the output node, the second input terminal being coupled to an output terminal of the buffer, and
   an inverter configured to have an input terminal and an output terminal, the input terminal being coupled to the output terminal of the Op-amp, the output terminal of the inverter being coupled to the output terminal of the buffer,
   wherein, the first bias voltage is output from the output terminal of the buffer.

8. The amplifier of claim 6, wherein the buffer includes:
   an Op-amp configured to have a first input terminal, a second input terminal and an output terminal, the first input terminal being coupled to the output node, the second input terminal being coupled to an output terminal of the buffer, and
   an inverter configured to have an input terminal and an output terminal, the input terminal being coupled to the output terminal of the Op-amp, the output terminal of the inverter being coupled to the output terminal of the buffer,
   wherein, the first bias voltage is output from the output terminal of the buffer.

9. The amplifier of claim 1, comprising:
   a second bias circuit configured to supply a second bias voltage to a second secondary coil of the second transformer;
   wherein the second bias circuit is configured to set the second bias voltage to a voltage greater than or equal to a second voltage on the basis of the input signal in a second operating area where the power of the output signal is less than or equal to a second power which is lower than the first power so that the power-gain characteristics of the output signal become closer to characteristics where gain of the output signal becomes constant in relation to the power of the output signal.

10. The amplifier of claim 9, wherein the second bias circuit includes:

a second envelope detector configured to output current corresponding to an amplitude of envelopes of the input signal in a case where the amplitude of the envelopes is greater than or equal to the second amplitude; and a second converter configured to convert the current output from the second envelope detector to the second bias voltage.

11. The amplifier of claim 2, wherein the first bias circuit is configured to set the first bias voltage to the voltage greater than or equal to the first voltage in accordance with the amplitude of the baseband signal in the first operating area.

12. The amplifier of claim 1, wherein the first primary side is coupled to a first primary coil and the first secondary side is coupled to the first secondary coil.

13. The amplifier of claim 9, wherein the second primary side is coupled to a second primary coil and the second secondary side is coupled to the second secondary coil.

* * * * *